US012568747B2

(12) United States Patent
Park et al.

(10) Patent No.: US 12,568,747 B2
(45) Date of Patent: Mar. 3, 2026

(54) DISPLAY DEVICE INCLUDING DISPLAY PANEL AND IMRPOVED COVER PANEL CONFIGURATION

(71) Applicant: Samsung Display Co., LTD., Yongin-si (KR)

(72) Inventors: Seong Sik Park, Yongin-si (KR); Jung Min Park, Yongin-si (KR); Yeong Seok Song, Yongin-si (KR)

(73) Assignee: SAMSUNG DISPLAY CO., LTD., Gyeonggi-do (KR)

( * ) Notice: Subject to any disclaimer, the term of this patent is extended or adjusted under 35 U.S.C. 154(b) by 393 days.

(21) Appl. No.: 18/134,180

(22) Filed: Apr. 13, 2023

(65) Prior Publication Data

US 2024/0107858 A1 Mar. 28, 2024

(30) Foreign Application Priority Data

Sep. 27, 2022 (KR) ......................... 10-2022-0122155

(51) Int. Cl.
*H10K 59/80* (2023.01)
*H10K 102/00* (2023.01)
(52) U.S. Cl.
CPC ......... *H10K 59/87* (2023.02); *H10K 59/8792* (2023.02); *H10K 59/8794* (2023.02); *H10K 2102/311* (2023.02)
(58) Field of Classification Search
None
See application file for complete search history.

(56) References Cited

U.S. PATENT DOCUMENTS

| | | | |
|---|---|---|---|
| 3,799,802 A | 3/1974 | Schneble, Jr. et al. | |
| 9,368,736 B2 | 6/2016 | Jung | |
| 2020/0368616 A1 | 11/2020 | Delamont | |
| 2022/0154050 A1* | 5/2022 | Kim | H10K 50/8445 |
| 2023/0209792 A1* | 6/2023 | Son | H05K 9/0067 361/220 |
| 2023/0217683 A1* | 7/2023 | Lee | H10K 50/865 257/40 |

FOREIGN PATENT DOCUMENTS

| | | |
|---|---|---|
| KR | 20190107235 | 9/2019 |
| KR | 20210113480 | 9/2021 |
| KR | 20220054486 | 5/2022 |
| WO | 2018224847 | 12/2018 |

* cited by examiner

*Primary Examiner* — Daniel Whalen
(74) *Attorney, Agent, or Firm* — CANTOR COLBURN LLP

(57) ABSTRACT

A display device includes, a display panel including a first area and a bending area adjacent to the first area in a first direction, a window on the display panel and including a light blocking member, a cover panel on the display panel, and a cover spacer on the display panel. The cover panel includes, first and second cushion layers, a heat dissipation layer between the first and second cushion layers, a light blocking layer between the first and second cushion layers and overlapping the heat dissipation layer, a base film between the display panel and the first cushion layer, and an upper bonding layer between the base film and the display panel. The light blocking layer and the heat dissipation layer overlap the light blocking member, and have ends protruding further in the first direction than ends of the upper bonding layer, the base film, and the cover spacer.

20 Claims, 17 Drawing Sheets

DISPLAY DEVICE INCLUDING DISPLAY PANEL AND IMRPOVED COVER PANEL CONFIGURATION

This application claims priority to Korean Patent Application No. 10-2022-0122155, filed on Sep. 27, 2022, and all the benefits accruing therefrom under 35 U.S.C. § 119, the content of which in its entirety is herein incorporated by reference.

BACKGROUND

1. Field

The disclosure relates to a display device.

2. Description of the Related Art

The importance of a display device is increasing with the development of multimedia. Examples of such a display device include a liquid crystal display (LCD), an organic light emitting display (OLED), and the like.

The organic light emitting display includes a display panel including an organic light emitting element. In the organic light emitting element, a cathode electrode and an anode electrode are disposed around an organic light emitting layer, and visible light is generated from the organic light emitting layer connected to the cathode and anode electrodes when a voltage is applied to the cathode and anode electrodes.

The organic light emitting display is widely used in portable electronic devices such as smartphones, and is easily exposed to external shocks. In addition, when excessive heat is generated in the organic light emitting element or a driving chip for driving the organic light emitting element, the organic light emitting element may be damaged. Accordingly, a cover panel having functions such as heat dissipation and cushioning is typically attached to a lower surface of the display panel prevent damage due to heat and external shocks.

SUMMARY

In a display device where a cover panel is disposed on a lower side of a display panel, an end of the cover panel may be visually recognized from an outside. In such a display device, the cover panel may be disposed to partially overlap a light blocking member of a window to prevent the end of the cover panel from being visually recognized, and a dead space may be generated in a portion where the cover panel overlaps the light blocking member.

Embodiments of the disclosure provide a miniaturized and integrated display device by preventing an end of a cover panel from being visually recognized from the outside and reducing a dead space.

Embodiments of the disclosure also provide a display device that prevents contact between a cover panel and an inner surface of a display panel and minimizes a risk of a crack occurrence even when the cover panel and the inner surface of the display panel are in contact with each other.

According to an embodiment of the disclosure, a display device includes a display panel including a first area and a bending area disposed adjacent to the first area in a first direction, a window disposed on a first surface of the display panel and including a light blocking member, a cover panel disposed on a second surface of the display panel, and a cover spacer on the second surface the display panel, where the cover panel is interposed between the cover spacer and the display panel. In such an embodiment, the cover panel includes a first cushion layer, a second cushion layer disposed on the first cushion layer, a heat dissipation layer disposed between the first cushion layer and the second cushion layer, a light blocking layer disposed between the first cushion layer and the second cushion layer and overlapping the heat dissipation layer, a base film disposed between the display panel and the first cushion layer, and an upper bonding layer disposed between the base film and the display panel, the light blocking layer and the heat dissipation layer overlap the light blocking member, and where one ends of the light blocking layer and the heat dissipation layer protrude further in the first direction than one ends of the upper bonding layer, the base film, and the cover spacer.

In an embodiment, the display device may further include a first pattern film disposed on the first area and disposed between the upper bonding layer and the display panel.

In an embodiment, the one ends of the light blocking layer and the heat dissipation layer may be aligned with one end of the first pattern film.

In an embodiment, the one ends of the light blocking layer and the heat dissipation layer may protrude further in the first direction than one end of the first pattern film.

In an embodiment, the one ends of the upper bonding layer and the base film may protrude further in the first direction than the one end of the first pattern film.

In an embodiment, one ends of the first cushion layer, the second cushion layer, the base film, and the upper bonding layer may be aligned with an end of the light blocking member adjacent to a transmission area of the window.

In an embodiment, the first cushion layer and the second cushion layer may overlap the light blocking member, and one ends of the first cushion layer and the second cushion layer may protrude further in the first direction than the one ends of the upper bonding layer, the base film, and the cover spacer.

In an embodiment, the one ends of the first cushion layer and the second cushion layer may overlap the bending area.

In an embodiment, the display device may further include a first pattern film disposed on the first area and disposed between the upper bonding layer and the display panel, where the one ends of the upper bonding layer and the base film protrude further in the first direction than one end of the first pattern film.

In an embodiment, at least one selected from the one ends of the first cushion layer and the second cushion layer may be in contact with the second surface of the display panel.

In an embodiment, a surface defined by one ends of the first cushion layer, the second cushion layer, the base film, and the upper bonding layer may include inclined surfaces.

In an embodiment, a surface defined by one ends of the light blocking layer, the heat dissipation layer, the first cushion layer, the second cushion layer, the base film, and the upper bonding layer may include curved surfaces.

According to an embodiment of the disclosure, a display device comprises a display panel including a first area and a bending area disposed adjacent to the first area in a first direction, a light blocking member disposed on a first surface of the display panel, and a cover panel disposed on a second surface of the display panel, where the cover panel includes, a heat dissipation layer, a light blocking layer disposed on the heat dissipation layer, a base film disposed on the light blocking layer, and an upper bonding layer disposed on the base film, and a cover panel edge, which is defined by one end of the cover panel, includes a portion protruding in the first direction.

In an embodiment, the cover panel edge may include a first edge defined by one ends of the light blocking layer and the heat dissipation layer, and a second edge defined by one ends of the base film and the upper bonding layer, and wherein the first edge may protrude further than the second edge.

In an embodiment, the cover panel edge may include a stepped portion.

In an embodiment, the cover panel edge may include an inclined surface.

In an embodiment, the cover panel edge may include a rounded curved surface.

According to an embodiment of the disclosure, a display device comprises a display panel including a first surface and a second surface opposite to the first surface, a first cushion layer disposed on the second surface of the display panel, a light blocking layer disposed on the first cushion layer, a heat dissipation layer disposed on the light blocking layer, a second cushion layer positioned on the heat dissipation layer, and a first interlayer bonding layer disposed between the light blocking layer and the heat dissipation layer, where the first interlayer bonding layer is in direct contact with the light blocking layer and the heat dissipation layer.

In an embodiment, the display device may further include a light blocking member disposed on the first surface of the display panel, where one ends of the light blocking layer and the heat dissipation layer overlap the light blocking member.

In an embodiment, one ends of the light blocking layer and the heat dissipation layer may protrude further than one ends of the first cushion layer and the second cushion layer.

According to embodiments, the display device may have a reduced size and be further integrated by preventing the end of the cover panel from being visually recognized from an outside and reducing a dead space.

According to embodiments of the disclosure, the display device may prevent the contact between the cover panel and the inner surface of the display panel and minimizes an occurrence of a crack even when the cover panel and the inner surface of the display panel are in contact with each other.

However, the features of the embodiments are not restricted to those set forth herein. The above and other effects of the embodiments will become more apparent to one of daily skill in the art to which the embodiments pertain by referencing the claims.

BRIEF DESCRIPTION OF THE DRAWINGS

The above and other features of embodiments of the disclosure will become more apparent by describing in detail embodiments thereof with reference to the attached drawings, in which.

DETAILED DESCRIPTION

Figure 1:
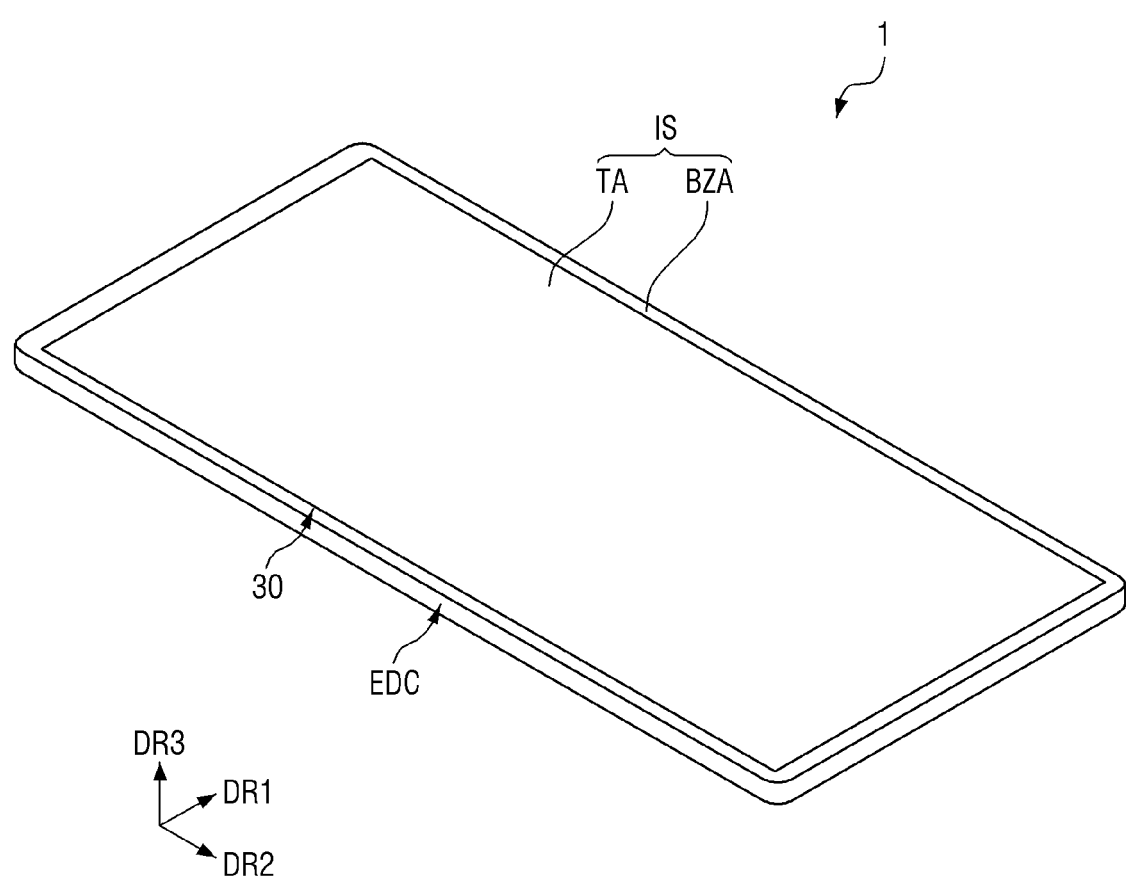
FIG. 1 is a perspective view of a display device according to an embodiment.

The invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/ or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described with reference to the accompanying drawings.

Figure 2:
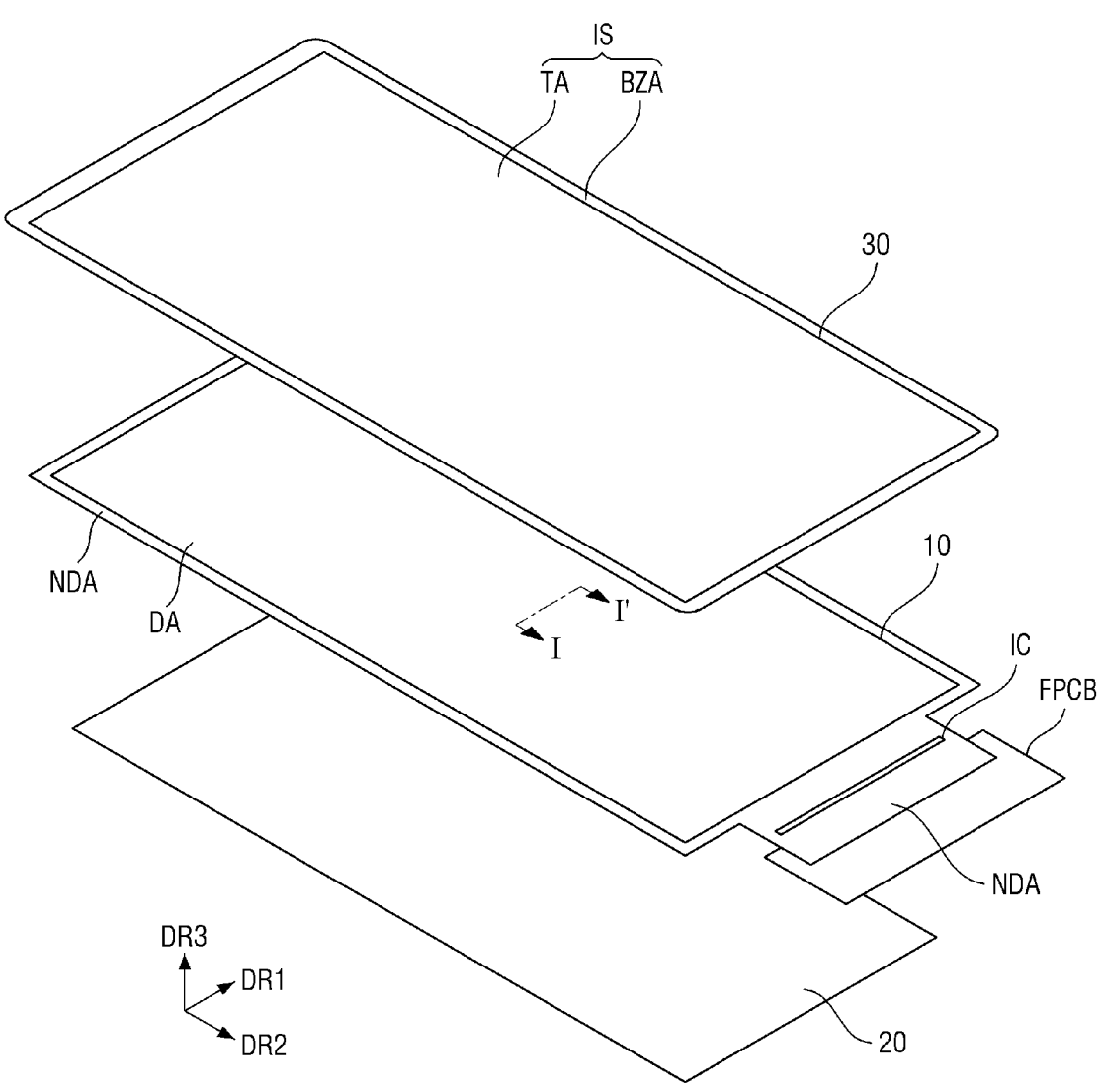
FIG. 2 is an exploded perspective view of the display device according to an embodiment.

FIG. 1 is a perspective view of a display device according to an embodiment. FIG. 2 is an exploded perspective view of the display device according to an embodiment.

Referring to FIGS. 1 and 2, an embodiment of a display device 1 may be a device activated in response to an electrical signal. The display device 1 may include various embodiments. In an embodiment, for example, the display device 1 may be applied to various electronic devices such as a smart phone, a smart watch, a tablet, a notebook computer, a computer, and a smart television.

The display device 1 may display an image in a third direction DR3 on a display surface IS parallel to each of a first direction DR1 and a second direction DR2. The display surface IS on which the image is displayed may correspond to a front surface of the display device 1. The image may include a still image as well as a dynamic image.

In the illustrated drawing, the first direction DR1 and the second direction DR2 are horizontal directions and intersect each other. For example, the first direction DR1 and the second direction DR2 may be orthogonal to each other. In addition, the third direction DR3 may be a vertical direction intersecting the first direction DR1 and the second direction DR2, for example, orthogonal to the first direction DR1 and the second direction DR2. For example, the third direction DR3 may be a thickness direction of the display device 1.

In embodiments described herein, a front surface (or an upper surface) and a rear surface (or a lower surface) of each member are defined based on the direction in which the image is displayed. The front surface and the rear surface may be opposed to each other in the third direction DR3, and a normal direction of each of the front surface and the rear surface may be parallel to the third direction DR3.

The front surface of the display device 1 may be divided into a transmission area TA and a bezel area BZA.

The transmission area TA may be an area in which an image is displayed. The user visually recognizes the image through the transmission area TA. In an embodiment, as shown in FIG. 1, the transmission area TA may have a rectangular shape with rounded vertices. However, this is illustrated by way of example, and the transmission area TA may have various shapes, and is not limited to any one embodiment.

The bezel area BZA is adjacent to the transmission area TA. The bezel area BZA may have a predetermined color. The bezel area BZA may surround the transmission area TA. Accordingly, the shape of the transmission area TA may be substantially defined by the bezel area BZA. However, this is illustrated by way of example, and the bezel area BZA may also be disposed adjacent to only one side of the transmission area TA or may also be omitted.

The display device 1 may include an outer case EDC.

The outer case EDC may accommodate a display module 10 and a lower module 20 shown in FIG. 2. In FIG. 2, the outer case EDC is omitted for convenience of illustration. The outer case EDC may be coupled to an upper module 30 to define an outer shape of the display device 1. The outer case EDC may protect components accommodated in the outer case EDC by absorbing a shock applied from the outside and preventing foreign substances/moisture from permeating into the display module 10. In an embodiment, the outer case EDC may be provided in a form in which a plurality of storage members are coupled to each other.

Figure 3:
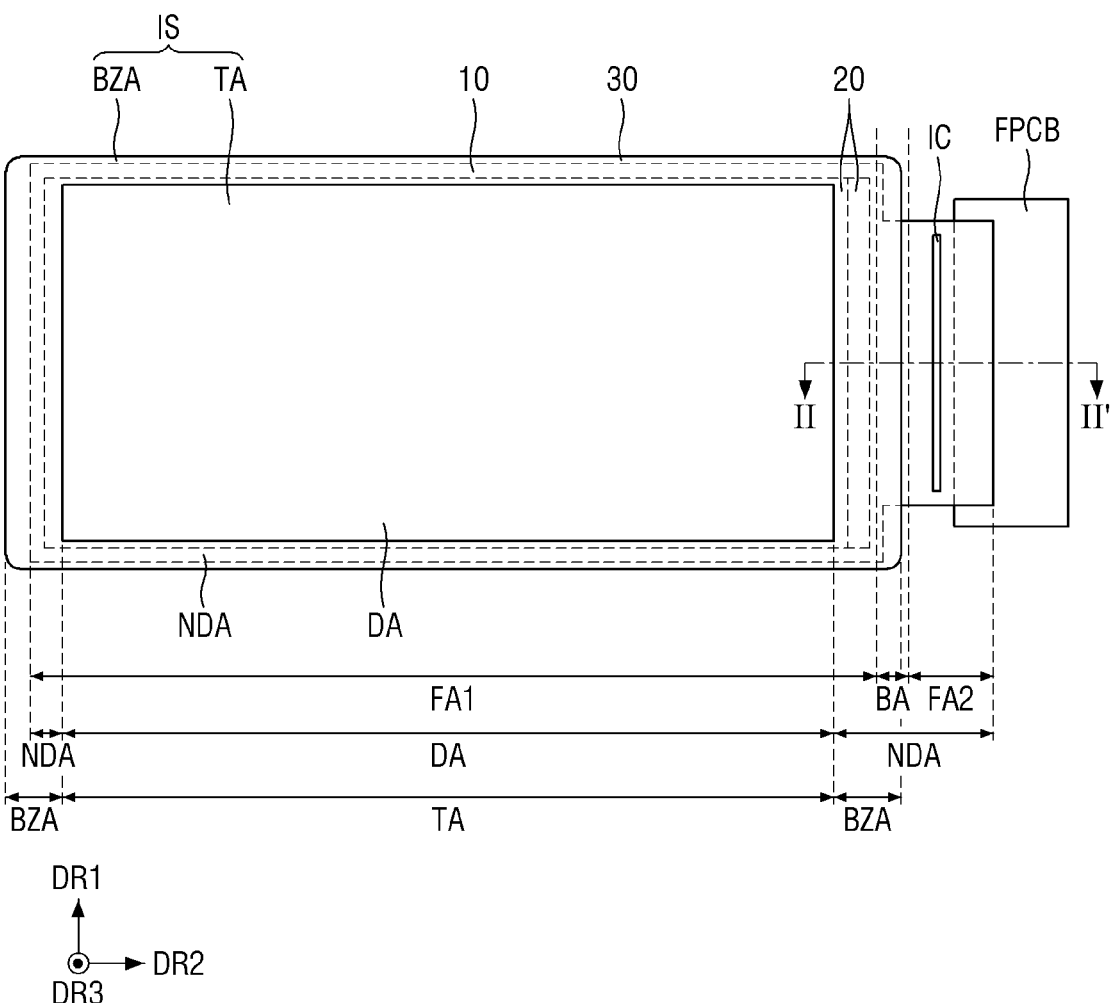
FIG. 3 is a plan view of the display device in a non-bending state according to an embodiment.
Figure 4:
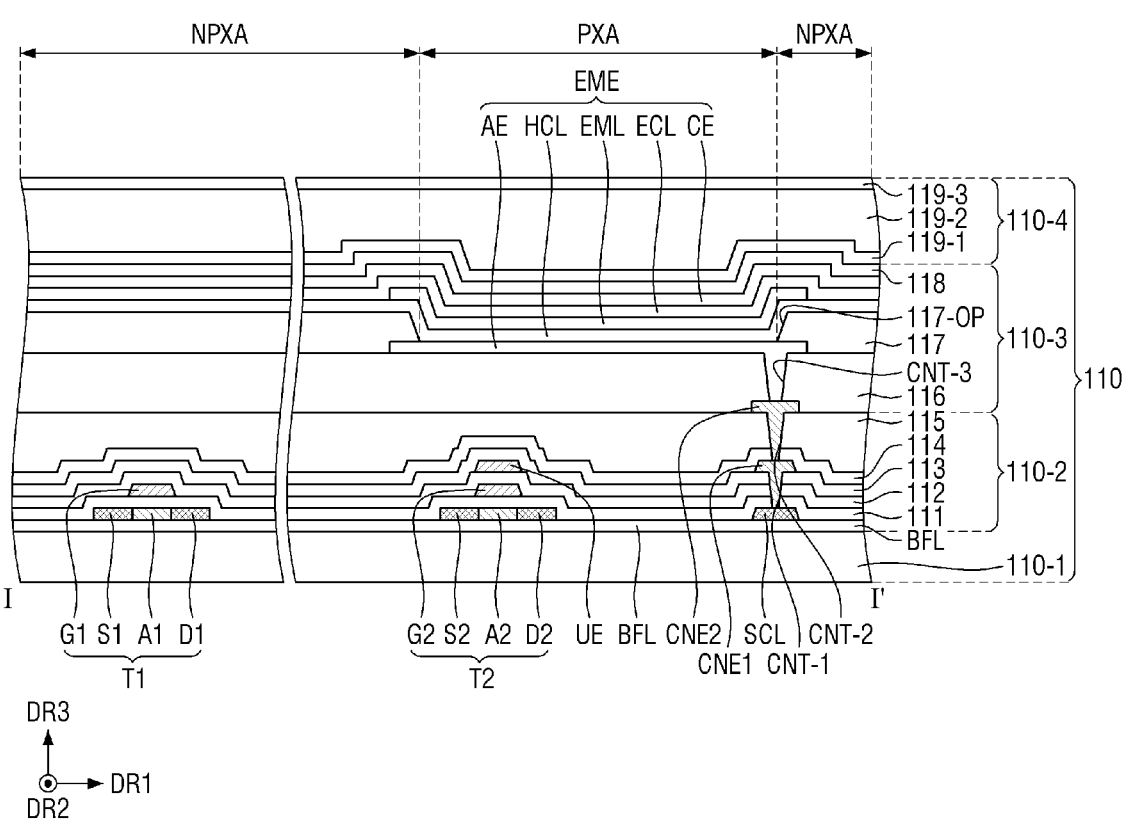
FIG. 4 is a schematic cross-sectional view taken along line I-I' of FIG. 2.
Figure 5:
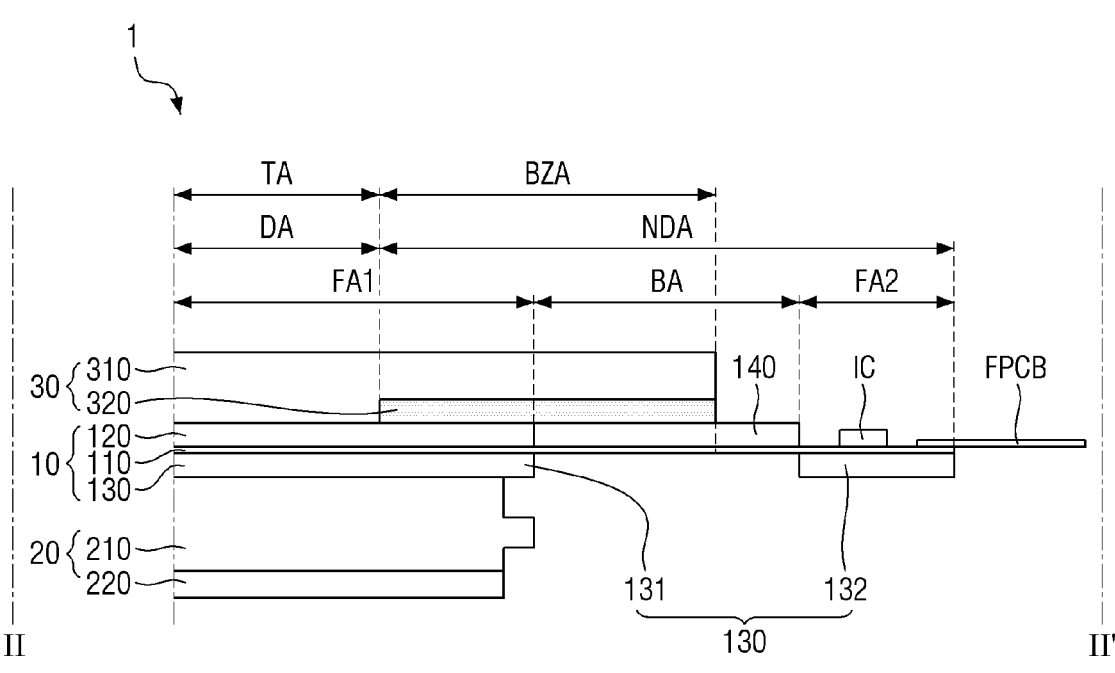
FIG. 5 is a schematic cross-sectional view taken along line II-II' of FIG. 3.
Figure 5:
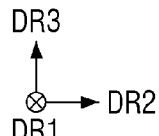
Figure 6:
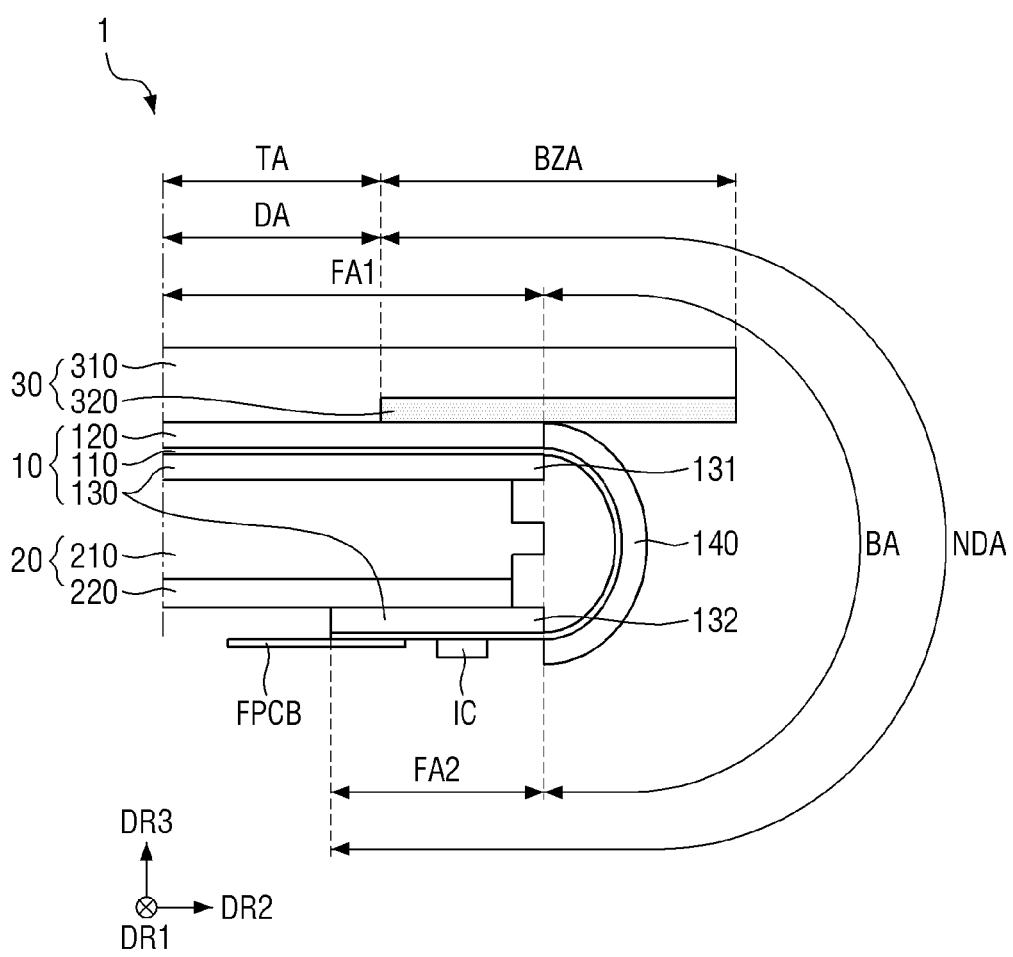
FIG. 6 is a cross-sectional view of the display device in a bent state according to an embodiment.

FIG. 3 is a plan view of the display device in a non-bending (or flat) state according to an embodiment. FIG. 4 is a schematic cross-sectional view taken along line I-I' of FIG. 2. FIG. 5 is a schematic cross-sectional view taken along line II-II' of FIG. 3. FIG. 6 is a cross-sectional view of the display device in a bent state according to an embodiment.

Referring to FIGS. 3 to 6, an embodiment of the display device 1 may include a display module 10, a lower module 20 disposed on a lower side of the display module 10, and an upper module 30 disposed on an upper side of the display module 10.

The display module 10 may include a display panel 110, an optical film 120 disposed on an upper side of the display panel 110, a pattern film layer 130 disposed on a lower side of the display panel 110, and a bending protective layer 140 disposed on the bending area BA.

The display panel 110 may display an image in response to an electrical signal. That is, the display panel 110, which is a panel that displays an image by an input data signal, may be applied as a panel such as an organic light emitting display panel, a liquid crystal display panel, a plasma display panel, an electrophoretic display panel, an elec-trowetting display panel, a quantum dot light emitting dis-play panel, and a micro light emitting diode (LED) display panel. Hereinafter, embodiments where the display panel 110 is an organic light emitting display panel will be described as an example for convenience of description.

The display panel 110 may include a flexible substrate including a flexible polymer material such as polyimide. Accordingly, the display panel 110 may be curved, bent, folded, or rolled.

The display panel 110 may include a display area DA for displaying an image and a non-display area NDA provided on at least one side of the display area DA.

In an embodiment, the display area DA have a quadran-gular shape, but this is merely an example. That is, the shape of the display area DA may have various shapes and is not limited to any one embodiment.

The non-display area NDA may be disposed to be adja-cent to the display area DA. In an embodiment, as illustrated in FIG. 1, the non-display area NDA may be disposed to surround the display area DA.

The display panel 110 may further include a bending area BA having flexibility and folded in one direction and a flat area FA that is continuous to or extending from at least one side of the bending area BA and is not folded. The flat area FA may or may not have flexibility.

In some embodiments, the bending area BA may be provided or defined in the non-display area NDA. However, the disclosure is not limited thereto, and the bending area BA may also be provided or defined in the display area DA. The flat area FA may include a first flat area FA1 and a second flat area FA2 spaced apart from each other with the bending area BA interposed therebetween. The first flat area FA1 may be provided or defined in at least a portion of the display area DA and the non-display area NDA. The bending area BA may be continuous to the first flat area FA1 and may be provided or defined in the non-display area NDA. The second flat area FA2 may be continuous to the bending area BA and may be provided or defined in the non-display area NDA. The bending area BA and the second flat area FA2 may be provided or defined in at least a portion of a protruding area of the non-display area NDA.

In the bending area BA, the display panel 110 may be bent with a curvature in a lower direction, that is, in a direction opposite to the display surface. The bending area BA may have a constant radius of curvature, but is not limited thereto and may have different radii of curvature for each section. In an embodiment, for example, in the bending area BA, the display panel 110 may have a semi-circular shape or a semi-elliptical shape.

In an embodiment, the display panel 110 may be a light emitting display panel. In an embodiment, for example, the display panel 110 may be an organic light emitting display panel or a quantum dot light emitting display panel. A light emitting layer of the organic light emitting display panel may include an organic light emitting material. A light emitting layer of the quantum dot light emitting display panel may include quantum dots, quantum rods, and the like. Hereinafter, as described above, embodiments where the display panel 110 is an organic light emitting display panel will be described as an example.

The optical film 120 may be disposed on an upper surface of the display panel 110. The optical film 120 may include, but is not limited to, a polarizing film, a micro lens, a prism film, or the like.

The optical film 120 may be attached onto the upper surface of the display panel 110. In an embodiment, a bonding layer (not illustrated) including an adhesive mate-rial is disposed on a lower surface of the optical film 120, and the optical film 120 may be attached onto the upper surface of the display panel 110 through the adhesive material. The bonding layer (not illustrated) including the adhesive material may include an optically transparent bonding layer or a bonding transparent resin. In an embodi-ment, for example, the adhesive material may include an optically transparent pressure sensitive adhesive (PSA).

The pattern film layer 130 may be disposed on the lower surface of the display panel 110. The pattern film layer 130 may be disposed between the display panel 110 and an upper bonding layer 211 to prevent the display panel 110 and the lower module 20 disposed on the lower side of the display panel 110 from being in contact with each other.

The pattern film layer 130 may include a first pattern film 131 and a second pattern film 132 spaced apart from each other in the second direction DR2. The pattern film layer 130 may be disposed in at least a portion of the flat area FA. The pattern film layer 130 may not be disposed in the bending area BA. In an embodiment, for example, the first pattern film 131 may be disposed in at least a portion of the first flat area FA1, and the second pattern film 132 may be disposed in at least a portion of the second flat area FA2. Accordingly, an inner surface of the display panel 110 may be exposed toward a cover panel 210.

In an embodiment, the pattern film layer 130 may include polyethylene terephthalate (PET), polyimide (PI), polycar-bonate (PC), polyethylene (PE), polypropylene (PP), poly-sulfone (PSF), polymethyl methacrylate (PMMA), triacetyl cellulose (TAC), cycloolefin, or the like.

The bending protective layer 140 may be disposed on a partial area of the display panel 110. The bending protective layer 140 may be disposed on a bending area of the display panel 110. However, the bending protective layer 140 is not limited thereto, and may be disposed on a partial area of the non-display area NDA other than the bending area BA.

The bending protective layer 140 may include or be formed of a polymer compound such as polyimide, acrylate, or epoxy. The bending protective layer 140 may minimize an occurrence of cracks caused by stress applied to a substrate 110-1 (see FIG. 6) when the display panel 110 is bent and may block propagation of the cracks. Accordingly, durability of the display module 10 may be improved.

The display module 10 may further include a driving circuit IC and a flexible printed circuit board FPCB.

The driving circuit IC may include driving elements for driving pixels of the display panel 110. In an embodiment, for example, the driving circuit IC may include a scan driving circuit for generating a plurality of scan signals and transmitting the scan signals to scan lines, a data driving circuit for transmitting data signals to data lines, a light emitting control driving circuit for transmitting a light emitting control signal to light emitting control lines, and the like.

The driving circuit IC may be disposed on the upper surface of the display panel 110. In an embodiment, the driving circuit IC may be disposed on the non-display area NDA of the display panel 110. In an embodiment, as shown in FIG. 5, the driving circuit IC may be disposed on the display panel 110, but the disclosure is not limited thereto. In an alternative embodiment, for example, the driving circuit IC may be disposed on the flexible printed circuit board FPCB.

The flexible printed circuit board FPCB may be disposed on the upper surface of the display panel 110. The flexible printed circuit board FPCB may be electrically connected to the driving circuit IC. The flexible printed circuit board FPCB may be attached to any one of components included in the display panel 110 for electrical connection with the driving circuit IC on the display panel 110.

The flexible printed circuit board FPCB may include a plurality of driving elements. The plurality of driving elements may include a circuit unit for driving the display panel 110.

The driving circuit IC and the flexible printed circuit board FPCB may be disposed to oppose to the lower surface of the display panel 110, for example, a surface on which an image is not displayed, when the display panel 110 is bent.

The lower module 20 may be disposed on a lower surface of the display module 10. That is, the lower module 20 may be disposed on a rear surface of the display module 10, that is, a second surface thereof in the third direction DR3. In an embodiment, the lower module 20 may be in contact with the rear surface of the display module 10.

In an embodiment, as show in FIG. 6, the lower module 20 may be disposed between the opposing portions of the rear surface of the display module 10 in the third direction DR3 in the bent state of the display module 10. In an embodiment, for example, the lower module 20 may be disposed between the first pattern film 131 and the second pattern film 132 in the third direction DR3 in the bent state.

The lower module 20 may include a cover panel 210 and a cover spacer 220.

The cover panel 210 may be disposed on a lower surface of the first pattern film 131. The cover panel 210 may be attached to the display panel 110 or the pattern film layer 130 disposed on the lower side of the display panel 110 by the upper bonding layer 211 (see FIG. 8) included in the cover panel 210.

The cover panel 210 may perform a heat dissipation function, an electromagnetic wave shielding function, a buffer function, and/or a strength reinforcement function. The detailed structure and function of the cover panel 210 according to an embodiment will be described later in detail.

The cover spacer 220 may control the degree of bending of the display panel 110 by maintaining a constant distance between the cover panel 210 and the display panel 110 when the display panel 110 is bent.

In an embodiment, the cover spacer 220 may include a same material as cushion layers 213 and 216 (see FIG. 8) or a base film 212 (see FIG. 8), which will be described later. However, the cover spacer 220 is not limited thereto, and may include materials suitable for design conditions of the display panel 110, among materials having elasticity or materials capable of performing a supporting function. In an embodiment, for example, the cover spacer 220 may include a thermoplastic elastomer, polystyrene, polyolefin, polyurethane thermoplastic elastomer, or the like. In an alternative embodiment, for example, the cover spacer 220 may include polycarbonate (PC), polyimide (PI), polyethylene terephthalate (PET), or the like.

The upper module 30 may be disposed on an upper surface of the display module 10. That is, the upper module 30 may be disposed on the front surface of the display module 10, that is, a first surface thereof in the third direction DR3. In an embodiment, the upper module 30 may be in contact with the front surface of the display module 10.

The upper module 30 may include a window 310 and a light blocking member 320.

The window 310 may be disposed on the display module 10. The window 310 may be coupled to the display module 10 through an optically transparent adhesive member (OCA). The window 310 may protect the display module 10 from external shock and provide an input surface and/or a display surface to the user. The window 310 may include or be made of a transparent material capable of emitting an image. In an embodiment, for example, the window 310 may include or be made of glass, sapphire, plastic, or the like.

Although the window 310 is illustrated as a single layer in FIG. 5, the window 310 is not limited thereto and may have a multilayer structure. Such a multilayer structure of the window 310 may be formed through a continuous process or an adhesion process using an adhesive layer. In an embodiment, the window 310 may wholly or partially have flexibility.

The upper module 30 may include the light blocking member 320 to prevent ancillary members disposed in the non-display area NDA from being visually recognized by the user.

The light blocking member 320 may be an organic film including a colored organic material. In an embodiment, for example, the light blocking member 320 may be a black organic film. The light blocking member 320 may be formed on a rear surface of the window 310 by a coating method.

The light blocking member 320 may be disposed in one area of the window 310. In an embodiment, for example, the light blocking member 320 may be disposed in a recessed portion of a lower side of the window 310. A lower surface of the light blocking member 320 may coincide with a lower surface of the window 310.

The light blocking member 320 may be formed to surround a periphery of the window 310. In an embodiment, the light blocking member 320 may be disposed substantially in the bezel area BZA. Accordingly, the non-display area NDA of the display panel 110 may correspond to an area overlapping the light blocking member 320 in the third direction DR3, that is, in the thickness direction of the display device 1. However, the disclosure is not limited thereto, and the non-display area NDA may not overlap the light blocking member 320 depending on an angle visually recognized by the user.

Referring to FIG. 4, an embodiment of the display panel 110 may include a plurality of insulating layers, a semiconductor pattern, a conductive pattern, a signal line, or the like. In an embodiment, an insulating layer, a semiconductor layer, and a conductive layer may be formed by coating, vapor deposition, or the like. Thereafter, the insulating layer, the semiconductor layer, and the conductive layer may be selectively patterned by a photolithography method. In such an embodiment, a semiconductor pattern, a conductive pattern, a signal line, and the like included in a circuit element layer 110-2 and a display element layer 110-3 may be formed on a base layer 110-1. Thereafter, an encapsulation layer 110-4 covering the display element layer 110-3 may be formed.

The base layer 110-1 may include a synthetic resin layer. The synthetic resin layer may include a thermosetting resin. The base layer 110-1 may have a multilayer structure. In an embodiment, for example, the base layer 110-1 may have a three-layer structure of a synthetic resin layer, an adhesive layer, and a synthetic resin layer. In such an embodiment, the synthetic resin layer may be a polyimide-based resin layer, and a material thereof is not particularly limited. The synthetic resin layer may include at least one selected from acrylic resins, methacrylic resins, polyisoprene, vinyl resins, epoxy resins, urethane resins, cellulose resins, siloxane resins, polyamide resins, and perylene resins. In an embodiment, the base layer 110-1 may include a glass substrate, an organic/inorganic composite material substrate, or the like.

At least one inorganic layer may be formed on an upper surface of the base layer 110-1. The inorganic layer may include at least one selected from aluminum oxide, titanium oxide, silicon oxide, silicon oxynitride, zirconium oxide, and hafnium oxide. The inorganic layer may be formed in multiple layers. The multiple inorganic layers may constitute a barrier layer and/or a buffer layer. In an embodiment, as shown in FIG. 4, the display panel 110 may further include a buffer layer BFL.

The buffer layer BFL may improve a bonding force between the base layer 110-1 and the semiconductor pattern. The buffer layer BFL may include a silicon oxide layer and a silicon nitride layer. The silicon oxide layer and the silicon nitride layer may be alternately stacked one on another.

The semiconductor pattern may be disposed on the buffer layer BFL. The semiconductor pattern may include polysilicon. However, the disclosure is not limited thereto, and the semiconductor pattern may also include amorphous silicon or an oxide semiconductor.

In an embodiment, as illustrated in FIG. 6, a first semiconductor pattern of a first transistor T1 and a second semiconductor pattern of a second transistor T2 are disposed on the buffer layer BFL. The first semiconductor pattern includes a first source portion S1, a first channel portion A1, and a first drain portion D1, and the second semiconductor pattern includes a second source portion S2, a second channel portion A2, and a second drain portion D2. The first channel portion A1 is disposed between the first source portion S1 and the first drain portion D1, and the second channel portion A2 is disposed between the second source portion S2 and the second drain portion D2. FIG. 6 illustrates a portion of a connection signal line SCL. Although not illustrated separately, the connection signal line SCL may be connected to the second drain portion D2 of the second transistor T2 in a plan view.

A first insulating layer 111 may be disposed on the buffer layer BFL to cover the semiconductor pattern and the connection signal line SCL. The first insulating layer 111 may cover a plurality of semiconductor patterns. The first insulating layer 111 may be an inorganic layer and/or an organic layer, and may have a single layer or multilayer structure. The first insulating layer 111 may include at least one selected from aluminum oxide, titanium oxide, silicon oxide, silicon oxynitride, zirconium oxide, and hafnium oxide. In addition to the first insulating layer 111, an insulating layer of a circuit element layer 110-2 to be described later may be an inorganic layer and/or an organic layer, and may have a single layer or multilayer structure. The inorganic layer may include at least one selected from the above-described materials.

A first gate G1 of the first transistor T1 and a second gate G2 of the second transistor T2 may be disposed on the first insulating layer 111. The first and second gates G1 and G2 may overlap the first and second channel portions A1 and A2, respectively.

A second insulating layer 112 is disposed on the first insulating layer 111 and may cover the first and second gates G1 and G2. The second insulating layer 112 may be an inorganic layer and/or an organic layer, and may have a single layer or multilayer structure.

An upper electrode UE may be disposed on the second insulating layer 112. The upper electrode UE may overlap the second gate G2 of the second transistor T2. A portion of the second gate G2 and the upper electrode UE overlapping the second gate G2 may form a capacitor.

The third insulating layer 113 is disposed on the second insulating layer 112 and may cover the upper electrode UE. The third insulating layer 113 may be an inorganic layer and/or an organic layer, and may have a single layer or multilayer structure.

A first connection electrode CNE1 may be disposed on the third insulating layer 113. The first connection electrode CNE1 may be connected to the connection signal line SCL through a first contact hole CNT-1 defined through the first to third insulating layers 111 to 113.

A fourth insulating layer 114 may be disposed on the third insulating layer 113. The fourth insulating layer 114 may be a silicon oxide layer of a single layer.

A fifth insulating layer 115 may be disposed on the fourth insulating layer 114. The fifth insulating layer 115 may be an organic layer.

A second connection electrode CNE2 may be disposed on the fifth insulating layer 115. The second connection electrode CNE2 may be connected to the first connection electrode CNE1 through a second contact hole CNT-2 defined through the fourth insulating layer 114 and the fifth insulating layer 115.

A sixth insulating layer 116 is disposed on the fifth insulating layer 115 and may cover the second connection electrode CNE2. The sixth insulating layer 116 may be an organic layer.

A first electrode AE may be disposed on the sixth insulating layer 116. The first electrode AE is connected to the second connection electrode CNE2 through a third contact hole CNT-3 defined through the sixth insulating layer 116. An opening 117-OP may be defined in a pixel defining film 117. The opening 117-OP of the pixel defining film 117 may expose at least a portion of the first electrode AE.

The display area DA may include light emitting areas PXA and a non-light emitting area NPXA adjacent to the light emitting areas PXA. The non-light emitting area NPXA may surround the light emitting areas PXA. In an embodiment, each of the light emitting areas PXA is defined to correspond to a partial area of the first electrode AE exposed by the opening 117-OP.

A hole control layer HCL may be disposed in common in the light emitting areas PXA and the non-light emitting area NPXA. The hole control layer HCL may include a hole transport layer and may further include a hole injection layer. A light emitting layer EML may be disposed on the hole control layer HCL. The light emitting layer EML may be disposed in an area corresponding to the opening 117-OP. That is, the light emitting layer EML may be formed separately in each of the light emitting areas PXA.

An electron control layer ECL may be disposed on the light emitting layer EML. The electron control layer ECL may include an electron transport layer and may further include an electron injection layer. The hole control layer HCL and the electron control layer ECL may be formed in common in the light emitting areas PXA using an open mask. A second electrode CE may be disposed on the electron control layer ECL. The second electrode CE may have an integral shape and may be disposed in common in the light emitting areas PXA.

A capping layer 118 may be disposed on the second electrode CE and may be in contact with the second electrode CE. The capping layer 118 may include an inorganic material. The capping layer 118 may protect the second electrode CE from a subsequent process, for example, a sputtering process, and may improve a light emission efficiency of the light emitting element EME. The capping layer 118 may have a refractive index greater than that of a first inorganic layer 119-1 to be described later.

The encapsulation layer 110-4 may be disposed on the display element layer 110-3. The encapsulation layer 110-4 may include a first inorganic layer 119-1, an organic layer 119-2, and a second inorganic layer 119-3. The first inorganic layer 119-1 and the second inorganic layer 119-3 protect the display element layer 110-3 from moisture/oxygen, and the organic layer 119-2 protects the display element layer 110-3 from foreign substances such as dust particles. Each of the first inorganic layer 119-1 and the second inorganic layer 119-3 may include at least one selected from a silicon nitride layer, a silicon oxy nitride layer, and a silicon oxide layer. The organic layer 119-2 may include an acryl-based organic layer, but is not limited thereto.

Hereinafter, a detailed structure and function of the cover panel according to an embodiment will be described with reference to FIGS. 7 to 9.

Figure 7:
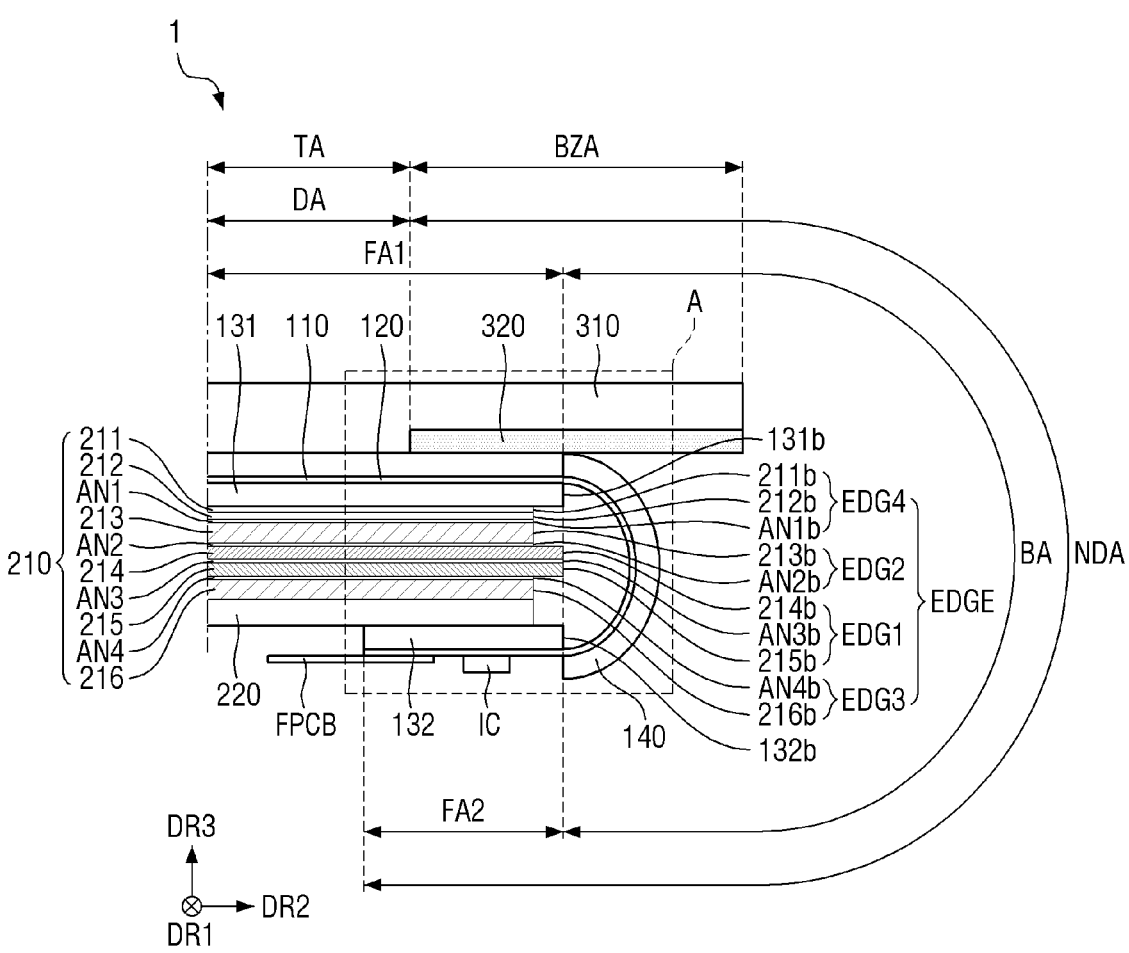
FIG. 7 is a cross-sectional view of a display device illustrating a detailed structure of a cover panel according to an embodiment.

FIG. 7 is a cross-sectional view of a display device illustrating a detailed structure of a cover panel according to an embodiment. FIG. 8 is a cross-sectional view of the cover panel according to an embodiment. FIG. 9 is an enlarged cross-sectional view of area A of FIG. 7.

Figure 8:
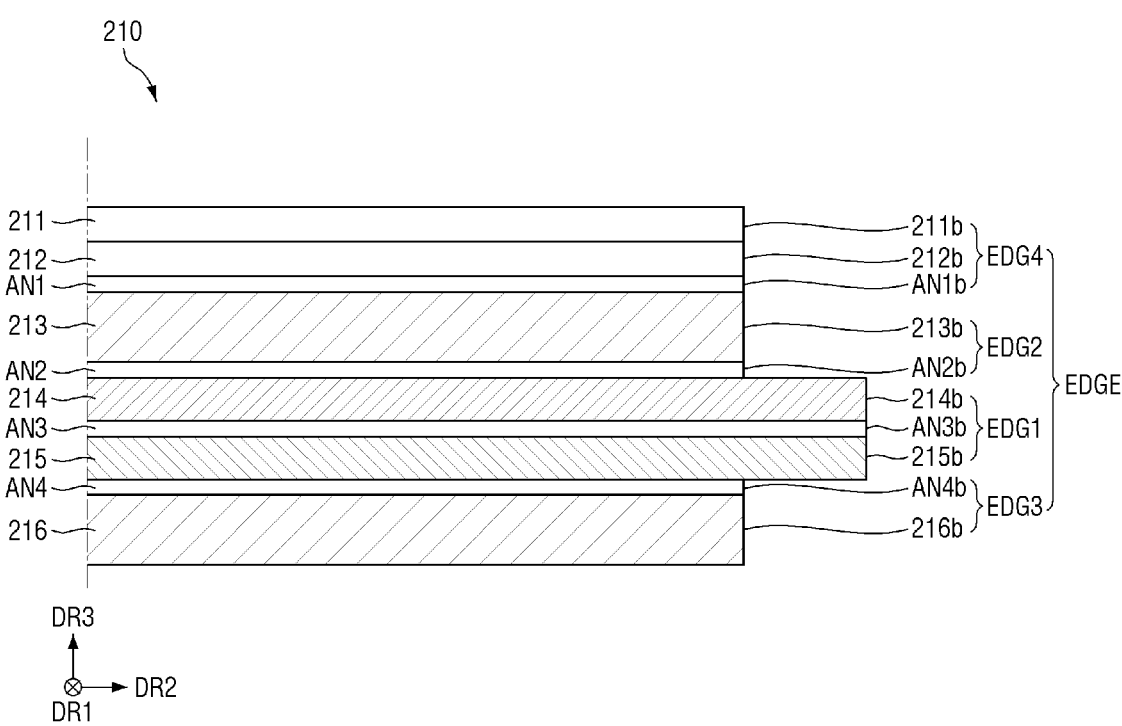
FIG. 8 is a cross-sectional view of the cover panel according to an embodiment.
Figure 9:
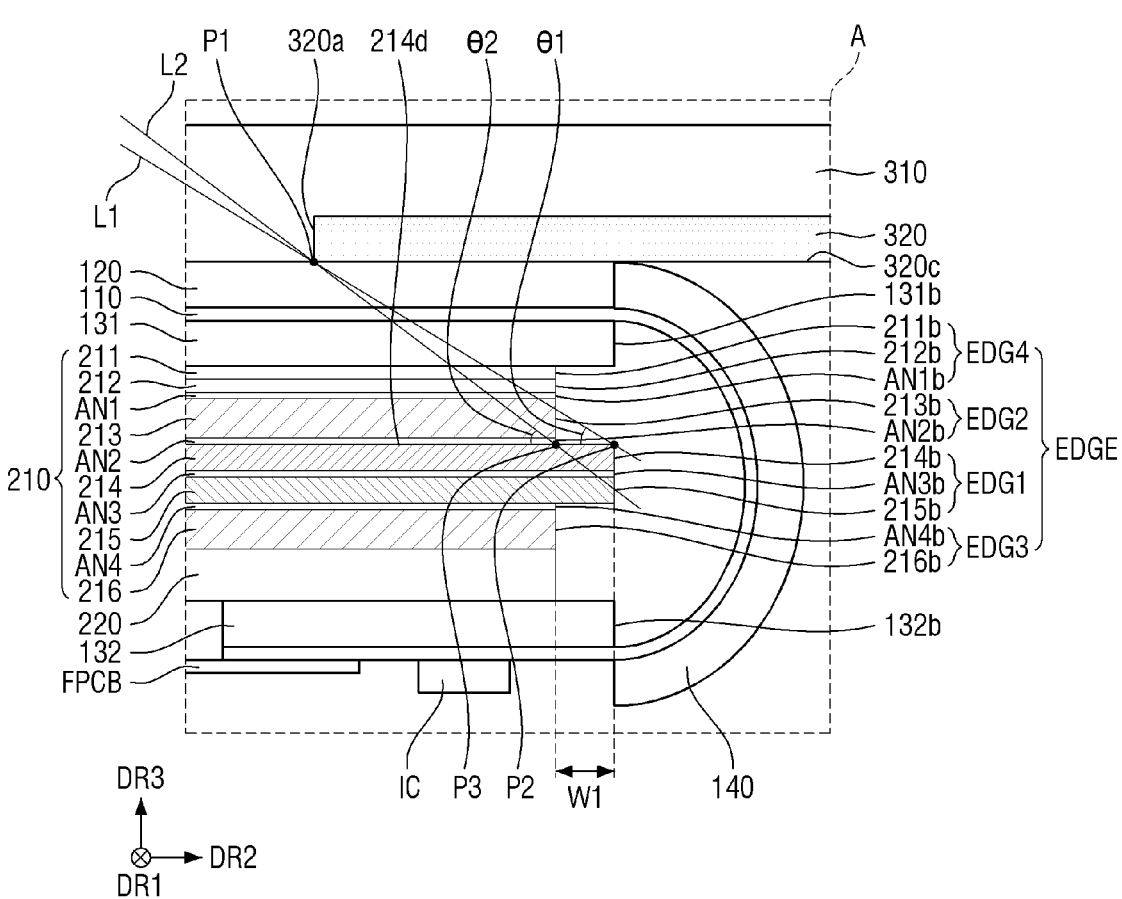
FIG. 9 is an enlarged cross-sectional view of area A of FIG. 7.

Referring to FIGS. 7 to 9, an embodiment of the cover panel 210 may be disposed on the lower (or inner) surface of the display module 10. The cover panel 210 includes at least one functional layer. The functional layer may be a layer that performs a heat dissipation function, an electromagnetic wave shielding function, a buffer function, a strength reinforcement function, a support function, an adhesion function, and the like. The functional layer may be a sheet layer including or made of a sheet, a film layer made of a film, a thin film layer, a coating layer, a panel, a plate, or the like. One functional layer may be formed as or defined by a single layer, but may also be formed of a plurality of stacked thin films or coating layers. The functional layer may be, for example, a support substrate, a heat dissipation layer, an electromagnetic wave shielding layer, a shock absorbing layer, a bonding layer, or the like.

In some embodiments, the cover panel 210 may include a second cushion layer 216, a heat dissipation layer 215 disposed on the second cushion layer, a light blocking layer 214 disposed on the heat dissipation layer 215, a first cushion layer 213 disposed on the light blocking layer 214, a base film 212 disposed on the first cushion layer 213, and an upper bonding layer 211 disposed on the base film 212.

The upper bonding layer 211 may be disposed on the base film 212. The upper bonding layer 211 may be disposed on the cover panel 210 to be in contact with the display module 10. The cover panel 210 and the display module 10 may be bonded to each other by the upper bonding layer 211. In some embodiments, the upper bonding layer 211 may include an adhesive layer, a cohesive layer, or a resin layer, and may include or be formed of a same material as interlayer bonding layers AN1 to AN4 to be described later.

In an embodiment, an embossing shaped structure (not shown) may be defined or formed on an upper surface of the upper bonding layer 211, that is, a surface in contact with the display module 10. In such an embodiment where the embossing shaped structure is formed on the upper surface of the upper bonding layer 211, when the cover panel 210 is attached to a lower portion of the display module 10, the embossing shaped structure on the upper surface may serve as an air passage to reduce air bubbles. When the upper bonding layer 211 is completely attached to the lower portion of the display module 10, the embossing shape of the upper surface of the upper bonding layer 211 may collapse and become flat as illustrated in FIG. 8, which will be described later.

The base film 212 may be disposed between the upper bonding layer 211 and the first cushion layer 213. The base film 212 may be a support member supporting the cover panel 210. In addition, the base film 212 may be a strength reinforcement member for reinforcing the display device 1 from external shock.

In some embodiments, the base film 212 may include at least one selected from polyethylene terephthalate (PET), polyimide (PI), polycarbonate (PC), polyethylene (PE), polypropylene (PP), polysulfone (PSF), polymethyl methacrylate (PMMA), triacetyl cellulose (TAC), cycloolefin polymer (COP), and the like.

The first cushion layer 213 may be disposed between the base film 212 and the light blocking layer 214. The first cushion layer 213 serves to absorb external shock and prevent the display device 1 from being damaged. The first cushion layer 213 may be formed as or defined by a single layer or a plurality of stacked films.

The first cushion layer 213 may include an elastically deformable material. In an embodiment, for example, the first cushion layer 213 may include thermoplastic elastomer, polystyrene, polyolefin, polyurethane thermoplastic elastomers, polyamides, synthetic rubbers, poly dimethylsiloxane, polybutadiene, polyisobutylene, poly(styrene-butadienestyrene), polyurethane, polychloroprene, polyethylene, silicone, or the like and combinations thereof, but is not limited thereto, and a suitable material may be selected from materials having elasticity within a range that does not affect image display of the display panel 110.

The light blocking layer 214 may be disposed between the first cushion layer 213 and the heat dissipation layer 215. The light blocking layer 214 may absorb or block light incident from the outside. The light blocking layer 214 may include a light blocking material or may be a colored film having low light transmittance. In an embodiment, for example, the light blocking layer 214 may be a black plastic film, for example, a black polyethyleneterephthalate (PET) film. When the display module 10 is viewed from the upper side of the upper module 30, the components disposed on a lower surface of the light blocking layer 214 may not be visually recognized by the user.

The heat dissipation layer 215 may be disposed between the light blocking layer 214 and the second cushion layer 216. The heat dissipation layer 215 may radiate heat generated inside the display device 1 to the outside and may shield electromagnetic waves. In some embodiments, the heat dissipation layer 215 may include or be made of a conductive metal selected from a metal having high thermal conductivity, such as copper, silver, gold, aluminum, nickel, or a combination thereof. In an embodiment, the heat dissipation layer 215 may include or be made of copper, for example.

In an embodiment, the heat dissipation layer 215 may further include a layer (not illustrated) including graphite and/or carbon nanotubes. The layer including graphite may be a graphitized polymer film, for example, a graphitized polyimide film.

The second cushion layer 216 may be disposed on a lower side of the heat dissipation layer 215. The second cushion layer 216 serves to absorb external shock and prevent the display device 1 from being damaged. The second cushion layer 216 may be formed as or defined by a single layer or a plurality of stacked films.

The second cushion layer 216 may include an elastically deformable material. In an embodiment, the second cushion layer 216 may include or be formed of substantially a same material as the first cushion layer 213 and may have a same thickness as the first cushion layer 213.

The cover panel 210 may further include interlayer bonding layers AN1 to AN4.

A first interlayer bonding layer AN1 may be disposed between the base film 212 and the first cushion layer 213 to bond the base film 212 and the first cushion layer 213 to each other. A second interlayer bonding layer AN2 may be disposed between the first cushion layer 213 and the light blocking layer 214 to bond the first cushion layer 213 and the light blocking layer 214 to each other. A third interlayer bonding layer AN3 may be disposed between the light blocking layer 214 and the heat dissipation layer 215 to bond the light blocking layer 214 and the heat dissipation layer 215 to each other. A fourth interlayer bonding layer AN4 may be disposed between the heat dissipation layer 215 and the second cushion layer 216 to bond the heat dissipation layer 215 and the second cushion layer 216 to each other.

The interlayer bonding layers AN1 to AN4 may include an adhesive layer, a cohesive layer, or a resin layer. In an embodiment, for example, the interlayer bonding layers AN1 to AN4 may include a polymer material classified into silicone-based, urethane-based, SU polymer having a silicone-urethane hybrid structure, acrylic-based, isocyanate-based, polyvinyl alcohol-based, gelatin-based, vinyl-based, latex-based, polyester-based, and water-based polyester-based.

In an embodiment, the interlayer bonding layers AN1 to AN4 may include an acrylic-based material, and may include an optically transparent pressure sensitive adhesive (PSA) as an adhesive material.

In such an embodiment, the light blocking layer 214 and the heat dissipation layer 215 may partially overlap the light blocking member 320 in the thickness direction, that is, in the third direction DR3. In an embodiment, for example, a width at which the light blocking layer 214 and the heat dissipation layer 215 overlap the light blocking member 320 may be about 100 micrometers (μm) to about 500 μm.

In an embodiment, as shown in FIG. 9, a first edge EDG1 may be disposed closer to the bending area BA than an end 320*a* of the light blocking member 320, that is, an end adjacent to the transmission area TA in the second direction DR2. Accordingly, the first edge EDG1 positioned on the lower surface of the display panel 110 may not be visually recognized from the outside. Since ends of the light blocking layer 214 including a colored material and the heat dissipation layer 215 including or made of a metal and having high reflectance are not visually recognized, a cover panel edge EDGE, which is one end of the cover panel 210, that is, an end on one side in the second direction DR2, may not be substantially visually recognized.

In an embodiment, the cover panel edge EDGE may include a step difference or have a step structure. That is, the cover panel edge EDGE may include a portion protruding toward the bending area BA. The first edge EDG1 defined by ends 214*b*, AN3*b*, and 215*b* of the light blocking layer 214, the third interlayer bonding layer AN3, and the heat dissipation layer 215 may have a structure protruding further than second edge EDG2 defined by one ends 213*b* and AN2*b* of the first cushion layer 213 and the second interlayer bonding layer AN2, a third edge EDG3 defined by one ends 216*b* and AN4*b* of the second cushion layer 216 and the fourth interlayer bonding layer AN4, and a fourth edge EDG4 defined by one ends 211*b*, 212*b*, and AN1*b* of the upper bonding layer 211, the base film 212, and the first interlayer bonding layer AN1. In an embodiment, for example, the first edge EDG1 may protrude further by a first width w1 than the second to fourth edges EDG2 to EDG4. In some embodiments, the first width w1 may be in a range of about 50 μm to about 150 μm.

In an embodiment, the first edge EDG1 may coincide with (aligned with when viewed in the third direction DR3) one ends 131*b* and 132*b* of the first and second pattern films 131 and 132. The second to fourth edges EDG2 to EDG4 may be positioned between the end 320*a* of the light blocking member 320 adjacent to the transmission area TA and the one ends 131*b* and 132*b* of the first and second pattern films 131 and 132. However, the disclosure is not limited thereto, and all of the first to fourth edges EDG1 to EDG4 may also be positioned between the end 320*a* of the light blocking member 320 adjacent to the transmission area TA and the one ends 131*b* and 132*b* of the first and second pattern films 131 and 132.

Referring to FIG. 9, as the first edge EDG1 protrudes further than the second to fourth edges EDG2 to EDG4, a viewing angle for the first edge EDG1 to be viewed from the outside may be smaller. In an embodiment, for example, on a cross section cut along the second and third directions DR2 and DR3, an angle between an imaginary line L1 connecting a first point P1 where the end 320*a* of the light blocking member 320 adjacent to the transmission area TA and a lower surface 320*c* of the light blocking member 320 meet each other and a second point P2 where the first edge EDG1 and an upper surface 214*d* of the light blocking layer 214 meet each other and the upper surface 214*d* of the light blocking layer 214 may be a first angle θ1. An angle between an imaginary line L2 connecting the first point P1 and a third point P3 where the second edge EDG2 and the upper surface 214*d* of the light blocking layer 214 meet each other and the upper surface 214*d* of the light blocking layer 214 may be a second angle θ2. The first angle θ1 may be smaller than the second angle θ2. That is, the viewing angle for the first edge EDG1 to be visually recognized from the outside may be smaller by a difference between the first angle θ1 and the second angle θ2 than when the first edge EDG1 does not protrude.

In some embodiment, in consideration of an error (assembly tolerance) that may occur when assembling the cover panel 210, the cover panel edge EDGE is intentionally moved in a direction of the bending area BA, that is, in the second direction DR2 so that the first edge EDG1 is not visually recognized, and accordingly, a dead space may be formed as much as the assembly tolerance. In an embodiment, for example, the assembly tolerance may be substantially the same as a width at which the cover panel 210 and the light blocking member 320 overlap each other. The assembly tolerance may be in a range of about 50 μm to about 400 μm.

In an embodiment of the cover panel 210, since the viewing angle for the first edge EDG1 to be visually recognized from the outside is smaller due to the structure in which the first edge EDG1 protrudes, the assembly tolerance may be reduced by the first width w1 from which the first edge EDG1 protrudes. As a result, the dead space is reduced, so that the display device 1 may be further miniaturized and integrated.

Hereinafter, a structure of a cover panel according to an alternative embodiment will be described with reference to FIGS. 10 to 17. In the following embodiments, any repetitive detailed description of the same elements as those of the embodiment described above will be omitted or simplified, and differences will be mainly described.

Figure 10:
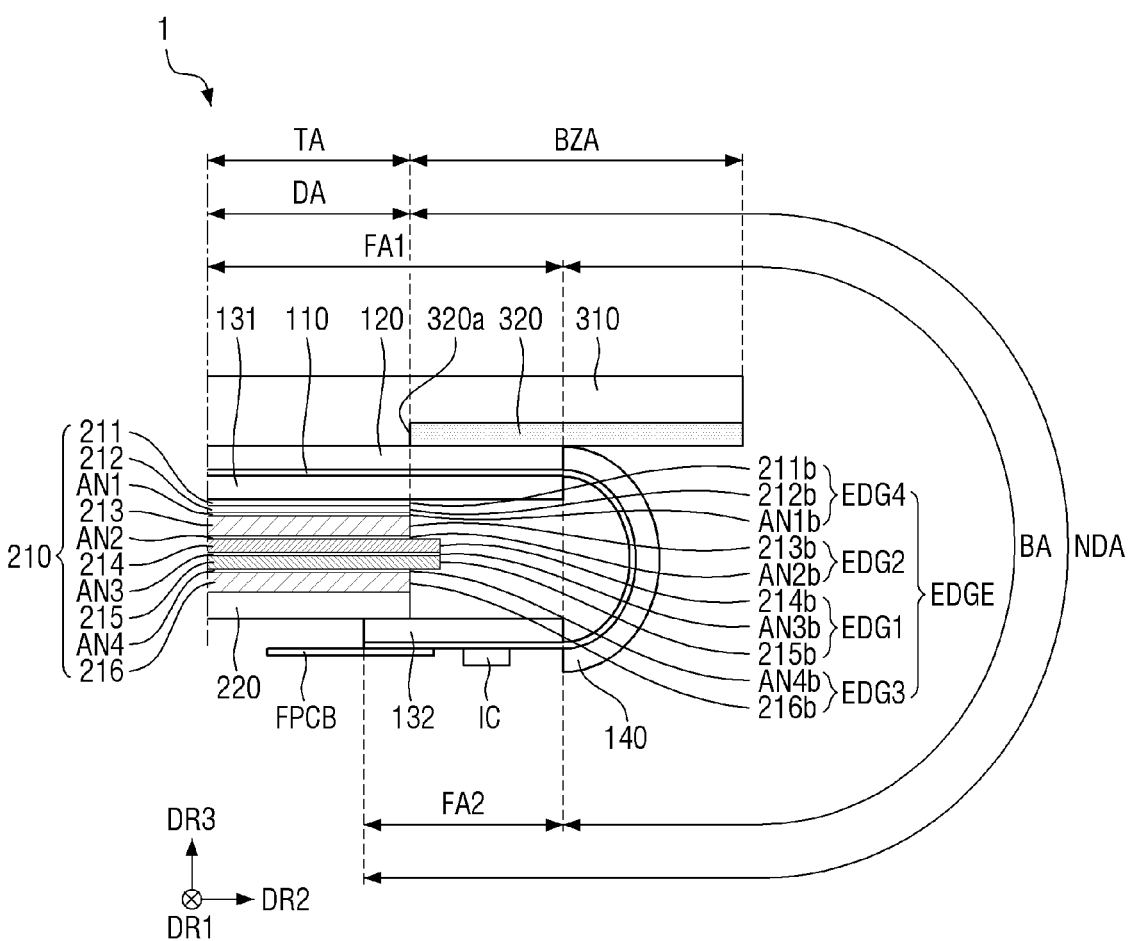
FIG. 10 is a cross-sectional view of the display device illustrating a detailed structure of a cover panel according to an alternative embodiment.

FIG. 10 is a cross-sectional view of the display device illustrating a detailed structure of a cover panel according to an alternative embodiment.

The embodiment of FIG. 10 is substantially the same as the embodiment of FIG. 7 except for a position of the cover panel edge EDGE.

In an embodiment, as shown in FIG. 10, the second to fourth edges EDG2 to EDG4 may coincide (or be aligned) with the end 320a of the light blocking member 320 adjacent to the transmission area TA in the second direction DR2. However, the disclosure is not limited thereto, and in some embodiments, the second to fourth edges EDG2 to EDG4 may be positioned further in a direction opposite to the second direction DR2 than the end 320a of the light blocking member 320 adjacent to the transmission area TA in the second direction DR2.

In such an embodiment, the light blocking layer 214 and the heat dissipation layer 215 may partially overlap the light blocking member 320 in the thickness direction, that is, in the third direction DR3 as in the embodiment of FIG. 7 described above. The first edge EDG1 may be positioned between the end 320a of the light blocking member 320 adjacent to the transmission area TA in the second direction DR2 and the one ends 131b and 132b of the first and second pattern films 131 and 132.

According to an embodiment of the cover panel 210, since the first edge EDG1 protrudes in the second direction DR2 by the first width w1 than the second to fourth edges EDG2 to EDG4, the first edge EDG1 overlaps the light blocking member 320 even if the second to fourth edges EDG2 to EDG4 do not overlap the light blocking member 320, and thus may not be visually recognized by the user. As a result, the cover panel edge EDGE may not be visually recognized from the outside.

Figure 11:
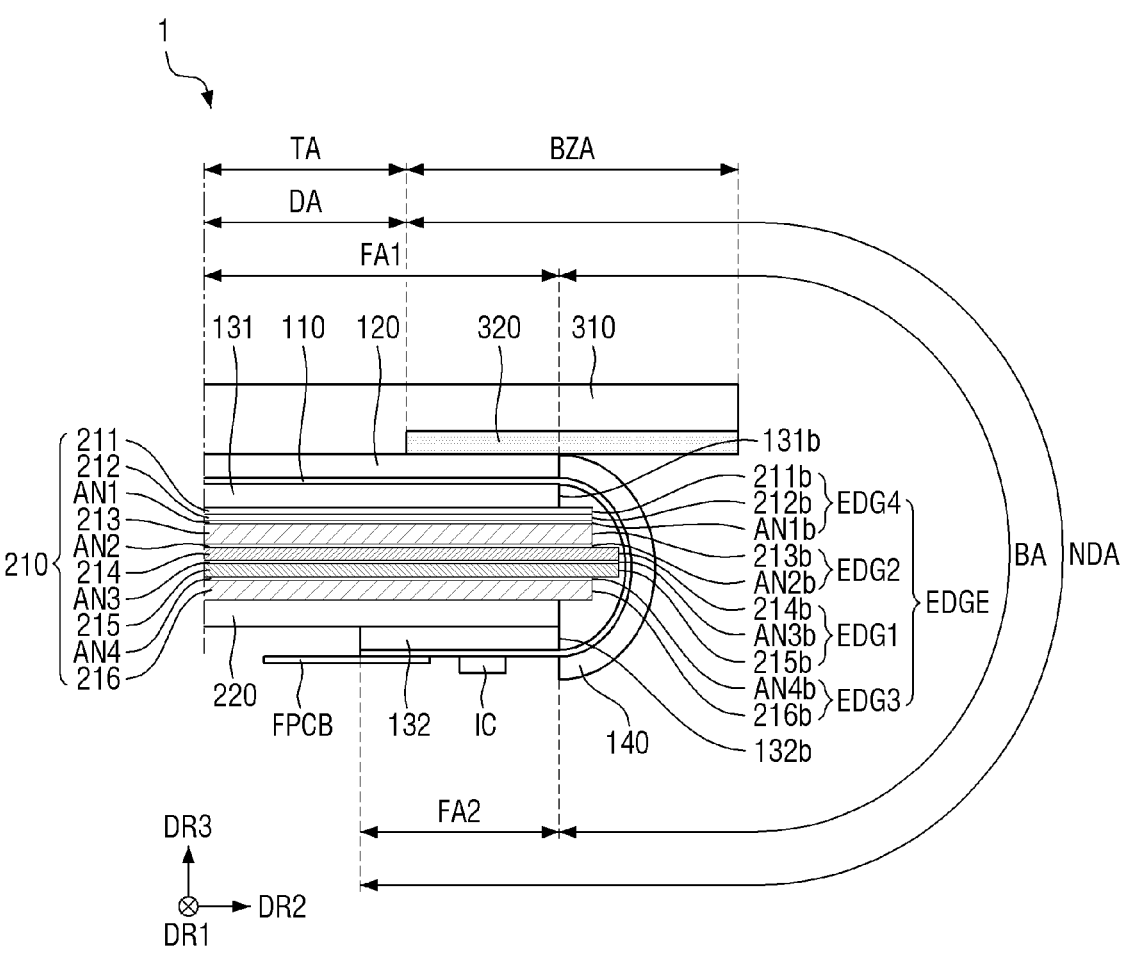
FIG. 11 is a cross-sectional view of the display device illustrating a detailed structure of a cover panel according to another alternative embodiment.

FIG. 11 is a cross-sectional view of the display device illustrating a detailed structure of a cover panel according to another alternative embodiment.

The embodiment of FIG. 11 is substantially the same as the embodiment of FIG. 7 except for a position of the cover panel edge EDGE.

In an embodiment, as shown in FIG. 11, the first to fourth edges EDG1 to EDG4 may be positioned in the bending area BA. In an embodiment, for example, the first to fourth edges EDG1 to EDG4 may be positioned further in the direction of the bending area BA, that is, in the second direction DR2 than the one ends 131b and 132b of the first and second pattern films 131 and 132. However, the disclosure is not limited thereto, and alternatively, the first edge EDG1 may be positioned in the bending area BA, and the second to fourth edges EDG2 to EDG4 may be positioned in the flat area FA.

In such an embodiment where the first edge EDG1 is positioned in the bending area, the first edge EDG1 may not be in contact with the inner surface, that is, the rear surface of the display panel 110. In an embodiment, for example, the cover panel 210 may include the cushion layers 213 and 216 disposed on opposing surfaces of the light blocking layer 214 and the heat dissipation layer 215 such that the light blocking layer 214 and the heat dissipation layer 215 are interposed between the cushion layers 213 and 216. That is, the light blocking layer 214 and the heat dissipation layer 215 may be disposed at a relatively intermediate height or positioned in a middle portion of the cover panel 210. Accordingly, the light blocking layer 214 and the heat dissipation layer 215 may be disposed in the bending area BA where a horizontal distance between the display panel 110 and the cover panel 210 in the second direction DR2 is the longest. As a result, even in the structure in which the first edge EDG1 protrudes, a possibility that the cover panel 210 and the inner surface of the display panel 110 come into contact with each other may be reduced, such that a risk of cracks that may occur on the inner surface of the display panel 110 in the bending area BA may be minimized.

Figure 12:
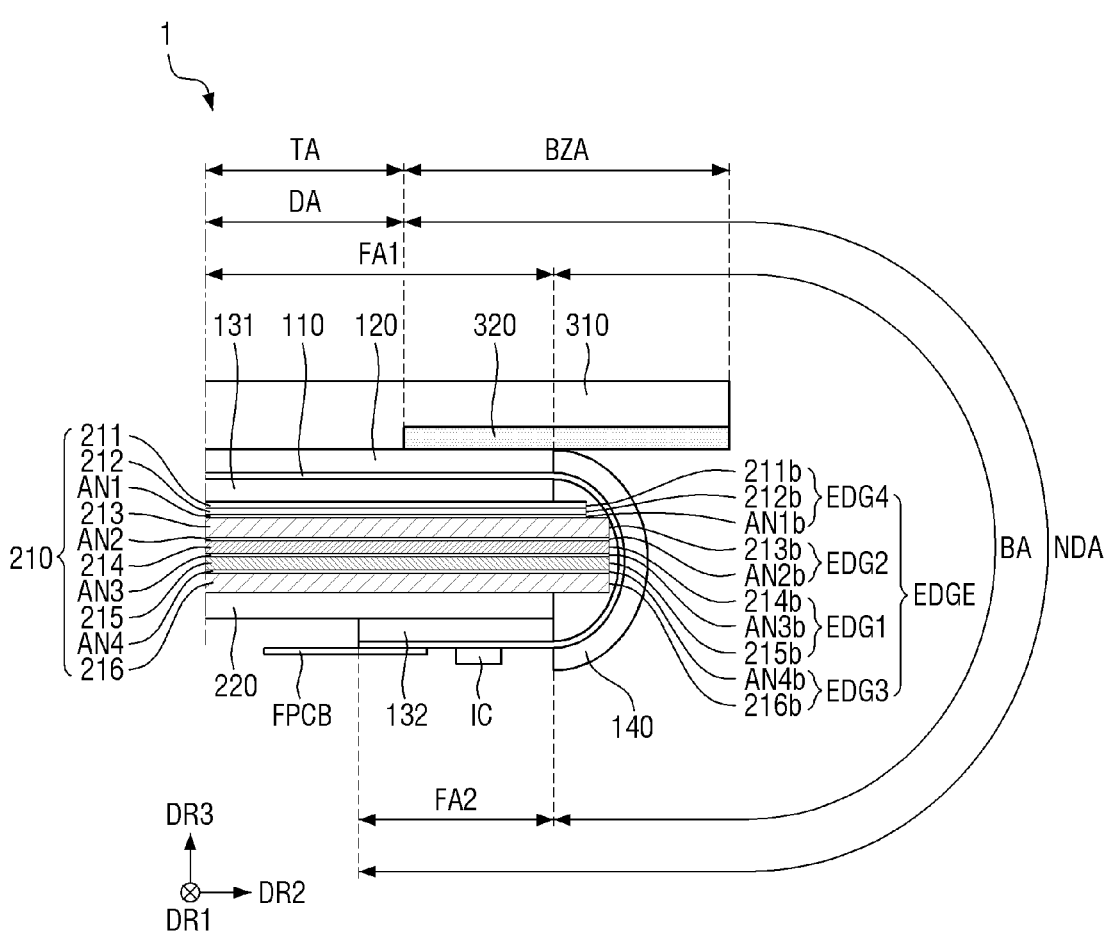
FIG. 12 is a cross-sectional view of the display device illustrating a detailed structure of a cover panel according to another alternative embodiment.
Figure 13:
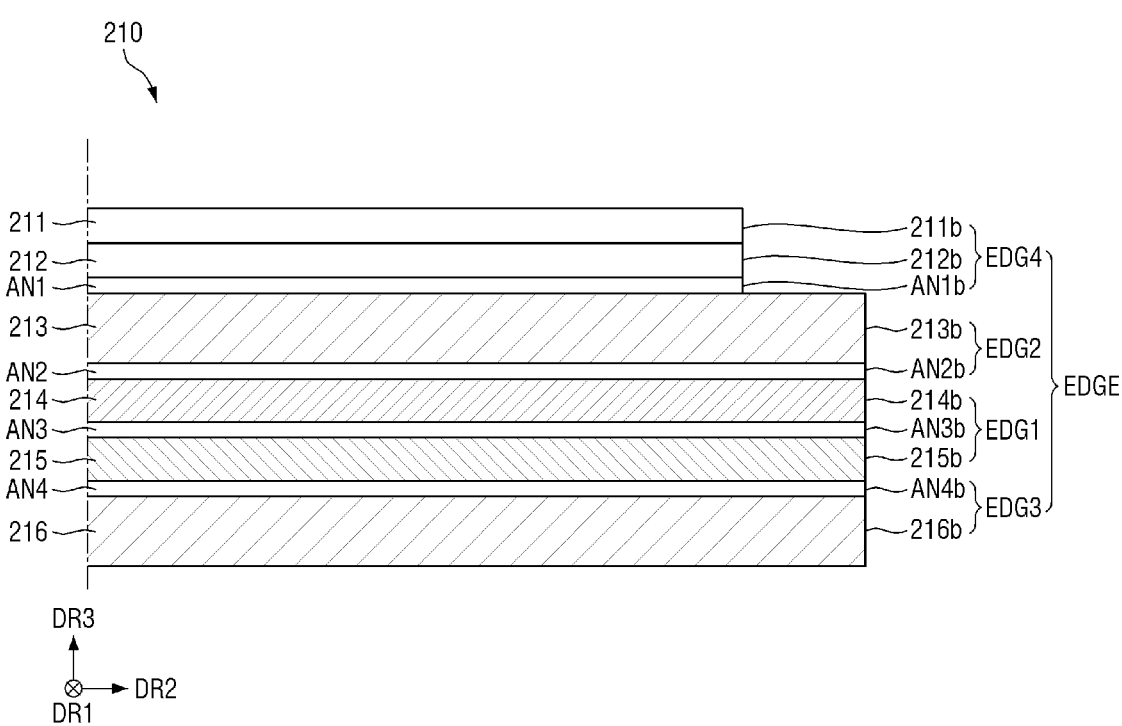
FIG. 13 is a cross-sectional view of the cover panel of FIG. 12.

FIG. 12 is a cross-sectional view of the display device illustrating a detailed structure of a cover panel according to another alternative embodiment. FIG. 13 is a cross-sectional view of the cover panel of FIG. 12.

The embodiment of FIGS. 12 and 13 is substantially the same as the embodiment of FIG. 7 except that not only the first edge EDG1, but also the second edge EDG2 and the third edge EDG3 protrude further than the fourth edge EDG4.

In an embodiment, as shown in FIGS. 12 and 13, the first to third edges EDG1 to EDG3 may have a structure that protrudes further in the direction of the bending area BA, that is, in the second direction DR2 than the fourth edge EDG4. The first to third edges EDG1 to EDG3 may coincide with each other in the thickness direction or the third direction DR3. In an embodiment, for example, the first to third edges EDG1 to EDG3 may protrude further by a first width w1 than the fourth edge EDG4. In some embodiments, the first width w1 may be in a range of about 50 μm to about 150 μm.

In an embodiment, as illustrated in FIG. 12, the first to fourth edges EDG1 to EDG4 may be positioned in the bending area BA. In an embodiment, for example, the first to fourth edges EDG1 to EDG4 may be positioned further in the direction of the bending area BA than the one ends 131b and 132b of the first and second pattern films 131 and 132.

According to an embodiment of the cover panel 210, at least one selected from the second edge EDG2 and the third edge EDG3 may be in contact with the inner surface of the display panel 110. In such an embodiment, even when the cover panel 210 and the inner surface of the display panel 110 come into contact with each other, the risk of crack occurrence may be minimized by the cushion layers 213 and 216.

In an embodiment, for example, the cover panel 210 may include the cushion layers 213 and 216 disposed on opposing surface of the light blocking layer 214 and the heat dissipation layer 215 such that the light blocking layer 214 and the heat dissipation layer 215 are interposed between the cushion layers 213 and 216. Since the cushion layers 213 and 216 protrude together with the light blocking layer 214 and the heat dissipation layer 215, the cushion layers 213 and 216 may be in contact with the display panel 110 before the light blocking layer 214 and the heat dissipation layer 215 are in contact with the display panel 110. Since the cushion layers 213 and 216 include an elastic material and perform a shock mitigation function, the risk of cracks occurring in the display panel 110 may be minimized.

Although FIG. 12 shows an embodiment where all of the first to fourth edges EDG1 to EDG4 are positioned in the bending area, the disclosure is not limited thereto. In some embodiments, the first to third edges EDG1 to EDG3 may be positioned in the bending area BA, and the fourth edge EDG4 may also be positioned in the flat area FA. In an alternative embodiment, the first to third edges EDG1 to EDG3 may also be disposed between the end 320a of the light blocking member 320 adjacent to the transmission area TA in the second direction DR2 and the one ends 131b and 132b of the first and second pattern films 131 and 132, and the fourth edge EDG4 may or may not overlap the light blocking member 320.

Figure 14:
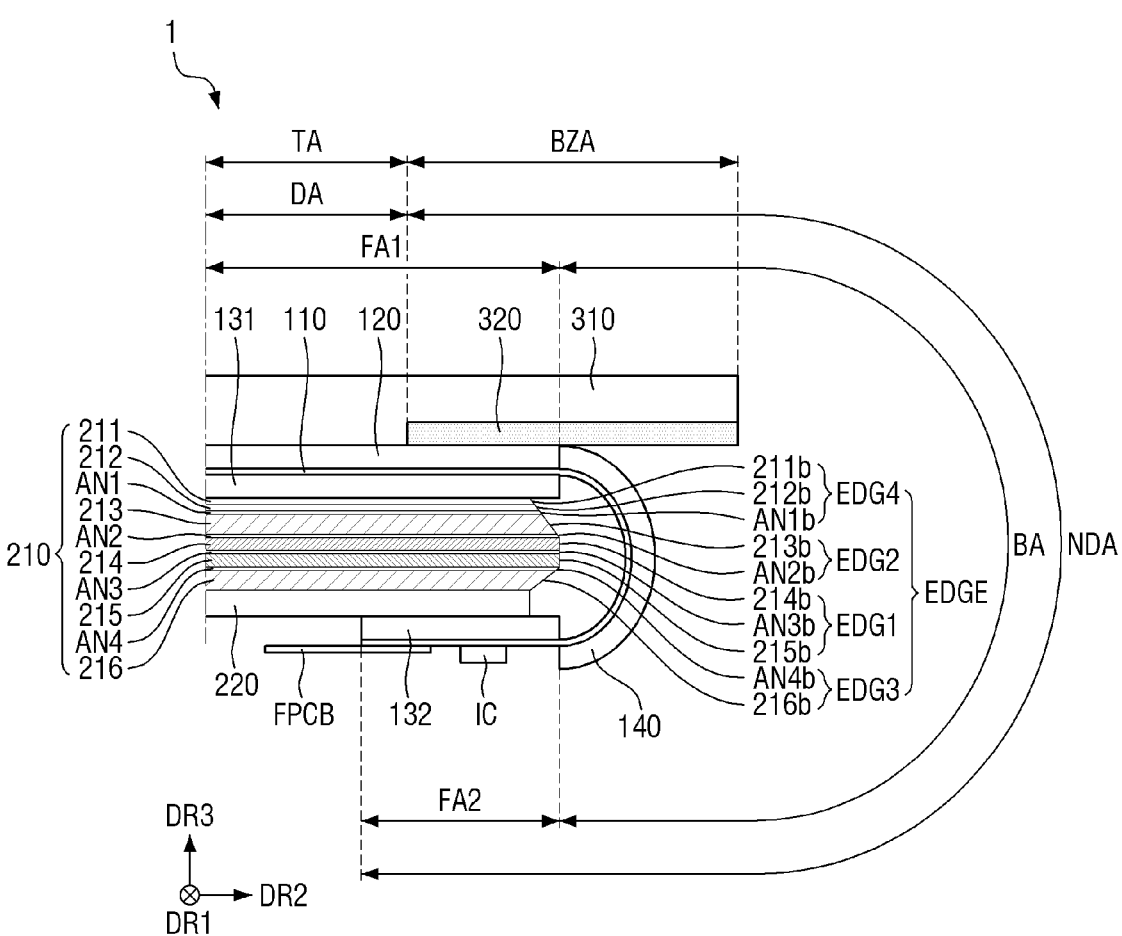
FIG. 14 is a cross-sectional view of the display device illustrating a detailed structure of a cover panel according to another alternative embodiment.
Figure 15:
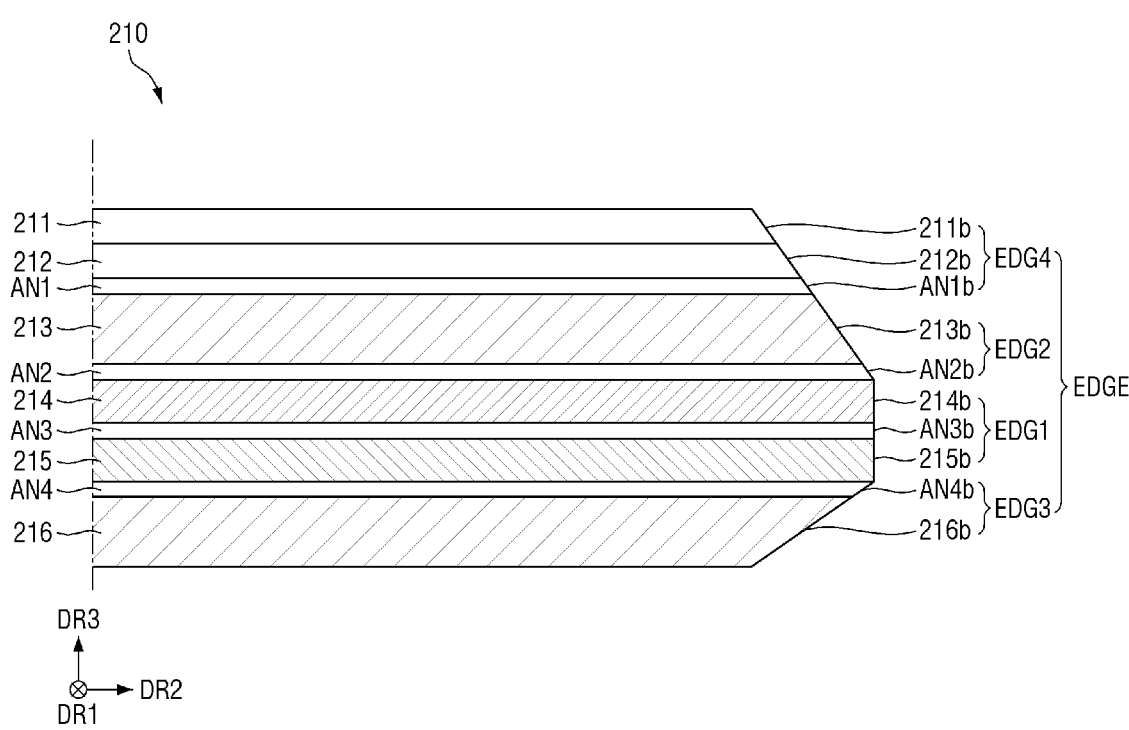
FIG. 15 is a cross-sectional view of the cover panel of FIG. 14.

FIG. 14 is a cross-sectional view of the display device illustrating a detailed structure of a cover panel according to another alternative embodiment; FIG. 15 is a cross-sectional view of the cover panel of FIG. 14.

The embodiment of FIGS. 14 and 15 is substantially the same as the embodiment of FIG. 7 except that the cover panel edge EDGE includes an inclined surface.

In an embodiment, as shown in FIGS. 14 and 15, the cover panel edge EDGE may include an inclined surface. In an embodiment, for example, the second to fourth edges EDG2 to EDG4 may include inclined surfaces inclined in a direction opposite to the second direction DR2. Accordingly, the cover panel edge EDGE may protrude in the second direction DR2 from the upper surface of the cover panel 210 toward the upper surface of the light blocking layer 214, and the cover panel edge EDGE may protrude in the second direction DR2 from the lower surface of the cover panel 210 toward the lower surface of the heat dissipation layer 215.

Although FIG. 14 shows an embodiment where the first edge EDG1 coincides with the one ends 131b and 132b of the first and second pattern films 131 and 132, the disclosure is not limited thereto. In some embodiments, the fact that the first edge EDG1 may also be positioned in the bending area BA and may also be disposed between the end 320a of the light blocking member 320 adjacent to the transmission area TA in the second direction DR2 and the one ends 131b and 132b of the first and second pattern films 131 and 132 is the same as in the embodiments of FIGS. 7 to 11 described above.

Figure 16:
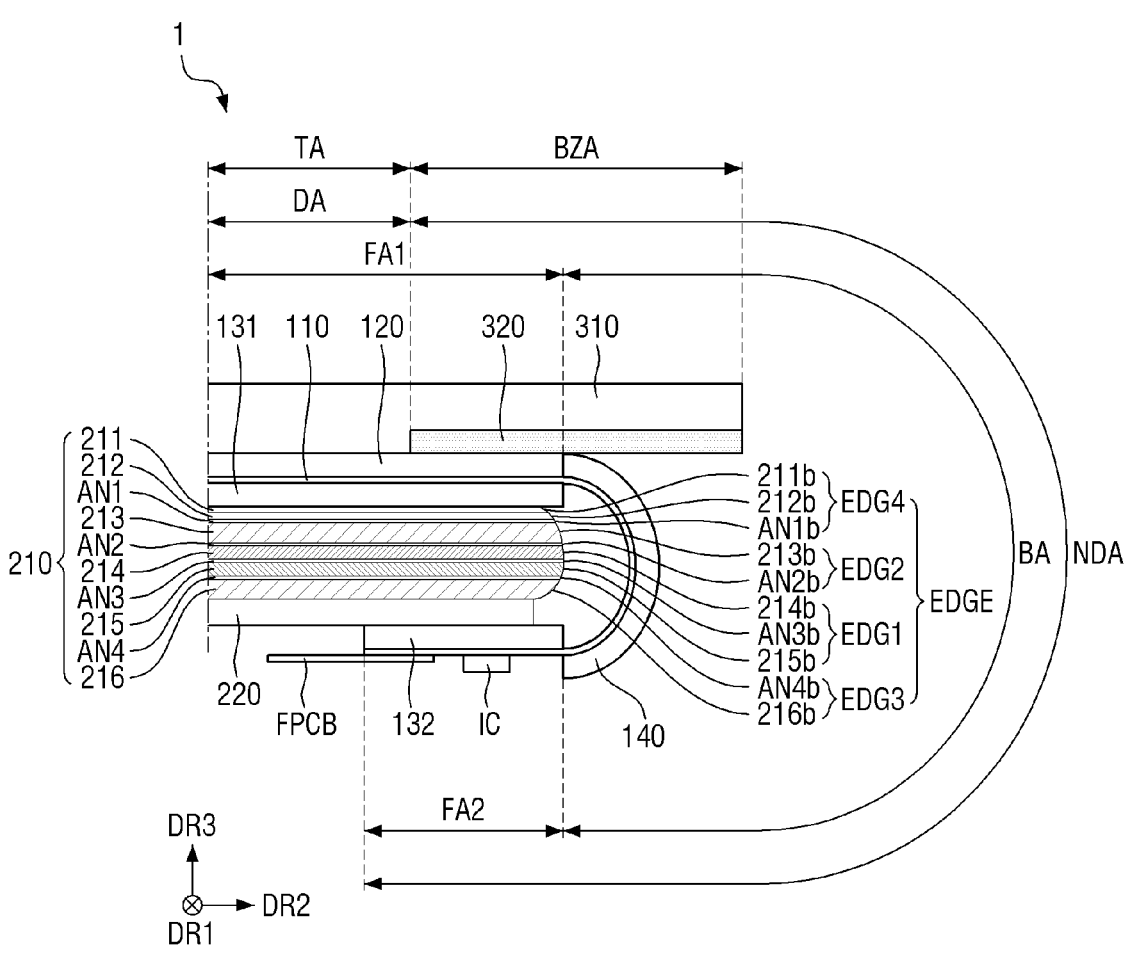
FIG. 16 is a cross-sectional view of the display device illustrating a detailed structure of a cover panel according to another alternative embodiment.
Figure 17:
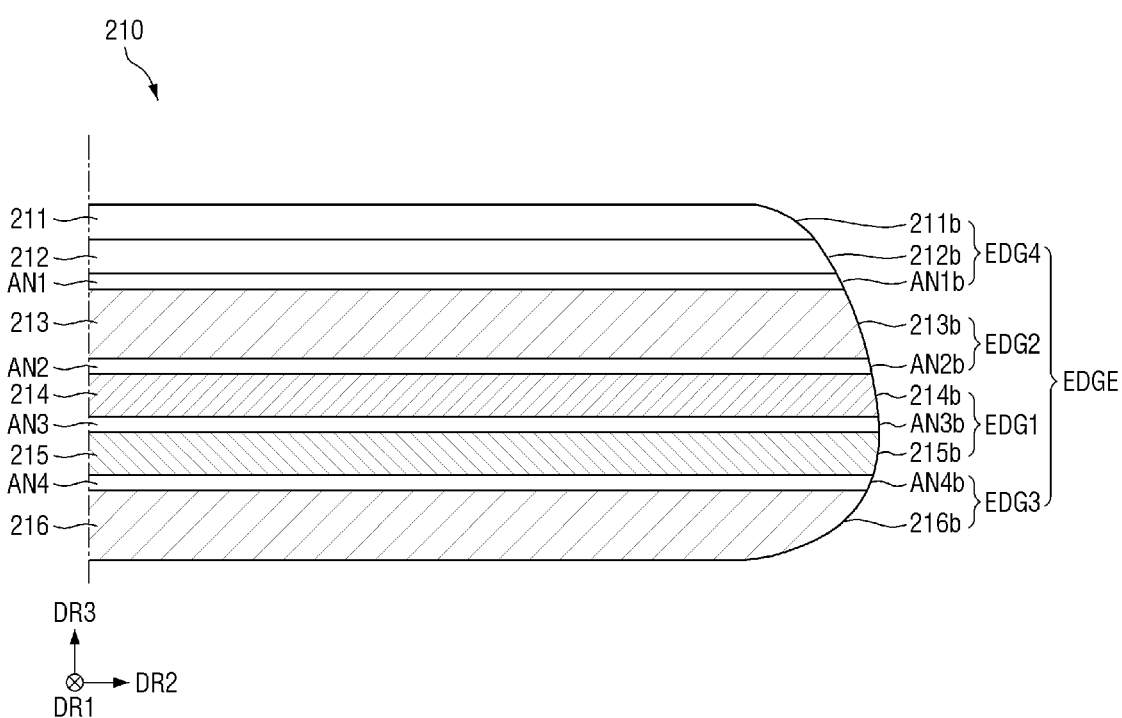
FIG. 17 is a cross-sectional view of the cover panel of FIG. 16.

FIG. 16 is a cross-sectional view of the display device illustrating a detailed structure of a cover panel according to another alternative embodiment. FIG. 17 is a cross-sectional view of the cover panel of FIG. 16.

The embodiment of FIGS. 16 and 17 is substantially the same as the embodiment of FIG. 7 except that the cover panel edge EDGE includes a rounded curved surface.

In an embodiment, as shown in FIGS. 16 and 17, the cover panel edge EDGE may include a rounded curved surface. In an embodiment, for example, the first to fourth edges EDG1 to EDG4 may include rounded curved surfaces. In an embodiment, the first edge EDG1 may protrude further in the second direction DR2 than the second to fourth edges EDG2 to EDG4. Accordingly, the cover panel edge EDGE may protrude in the second direction DR2 from the upper surface of the cover panel 210 toward the upper surface of the light blocking layer 214, and the cover panel edge EDGE may protrude in the second direction DR2 from the lower surface of the cover panel 210 toward the lower surface of the heat dissipation layer 215.

In an embodiment, the cover panel edge EDGE may have a constant radius of curvature, but is not limited thereto and may have a different radius of curvature for each section. In an embodiment, for example, the cover panel edge EDGE may have a semi-circular shape or a semi-elliptical shape.

Although FIG. 16 shows an embodiment where the right-most end of the first edge EDG1 coincides with the one ends 131b and 132b of the first and second pattern films 131 and 132, the disclosure is not limited thereto. In some embodiments, the fact that the first edge EDG1 may also be positioned in the bending area BA and may also be disposed between the end 320a of the light blocking member 320 adjacent to the transmission area TA in the second direction DR2 and the one ends 131b and 132b of the first and second pattern films 131 and 132 is the same as in the embodiments of FIGS. 7 to 11 described above.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as defined by the following claims.

What is claimed is:

1. A display device comprising:
a display panel including a first area and a bending area disposed adjacent to the first area in a first direction;
a window disposed on a first surface of the display panel and including a light blocking member;
a cover panel disposed on a second surface of the display panel, which is opposite to the first surface; and
a cover spacer disposed on the second surface of the display panel, wherein the cover panel is interposed between the cover spacer and the display panel,
wherein the cover panel includes:
a first cushion layer;
a second cushion layer disposed on the first cushion layer;
a heat dissipation layer disposed between the first cushion layer and the second cushion layer;
a light blocking layer disposed between the first cushion layer and the second cushion layer and overlapping the heat dissipation layer;
a base film disposed between the display panel and the first cushion layer; and
an upper bonding layer disposed between the base film and the display panel, and
wherein the light blocking layer and the heat dissipation layer overlap the light blocking member, and
wherein one ends of the light blocking layer and the heat dissipation layer protrude further in the first direction than one ends of the upper bonding layer, the base film, and the cover spacer.

2. The display device of claim 1, further comprising:
a first pattern film disposed on the first area and disposed between the upper bonding layer and the display panel.

3. The display device of claim 2,
wherein the one ends of the light blocking layer and the heat dissipation layer are aligned with one end of the first pattern film.

4. The display device of claim 2, wherein the one ends of the light blocking layer and the heat dissipation layer protrude further in the first direction than one end of the first pattern film.

5. The display device of claim 4, wherein the one ends of the upper bonding layer and the base film protrude further in the first direction than the one end of the first pattern film.

6. The display device of claim 1, wherein one ends of the first cushion layer, the second cushion layer, the base film, and the upper bonding layer are aligned with an end of the light blocking member adjacent to a transmission area of the window.

7. The display device of claim 1, wherein the first cushion layer and the second cushion layer overlap the light blocking member, and wherein one ends of the first cushion layer and the second cushion layer protrude further in the first direction than the one ends of the upper bonding layer, the base film, and the cover spacer.

8. The display device of claim 7, wherein the one ends of the first cushion layer and the second cushion layer overlap the bending area.

9. The display device of claim 8, further comprising:

a first pattern film disposed on the first area and disposed between the upper bonding layer and the display panel, wherein the one ends of the upper bonding layer and the base film protrude further in the first direction than one end of the first pattern film.

10. The display device of claim 8, wherein at least one selected from the one ends of the first cushion layer and the second cushion layer is in contact with the second surface of the display panel.

11. The display device of claim 1, wherein a surface defined by one ends of the first cushion layer, the second cushion layer, the base film, and the upper bonding layer include inclined surfaces.

12. The display device of claim 1, wherein a surface defined by one ends of the light blocking layer, the heat dissipation layer, the first cushion layer, the second cushion layer, the base film, and the upper bonding layer include curved surfaces.

13. A display device comprising:

a display panel including a first area and a bending area disposed adjacent to the first area in a first direction;

a light blocking member disposed on a first surface of the display panel; and a cover panel disposed on a second surface of the display panel, which is opposite to the first surface, wherein the cover panel includes:

a heat dissipation layer, a light blocking layer disposed on the heat dissipation layer;

a base film disposed on the light blocking layer; and an upper bonding layer disposed on the base film, and wherein a cover panel edge, which is defined by one end of the cover panel, includes a protruding portion which protrudes further in the first direction than another portion thereof, wherein the protruding portion of the cover panel edge includes one end of the heat dissipation layer, and wherein the first direction is perpendicular to a thickness direction of the cover panel.

14. The display device of claim 13, wherein the cover panel edge includes:

a first edge defined by one ends of the light blocking layer and the heat dissipation layer, and a second edge defined by one ends of the base film and the upper bonding layer, and wherein the first edge protrudes further than the second edge.

15. The display device of claim 13, wherein the cover panel edge includes a stepped portion.

16. The display device of claim 13, wherein the cover panel edge includes an inclined surface.

17. The display device of claim 13, wherein the cover panel edge includes a rounded curved surface.

18. A display device comprising:

a display panel including a first surface and a second surface opposite to the first surface;

a first cushion layer disposed on the second surface of the display panel;

a light blocking layer disposed on the first cushion layer;

a heat dissipation layer disposed on the light blocking layer;

a second cushion layer disposed on the heat dissipation layer; and a first interlayer bonding layer disposed between the light blocking layer and the heat dissipation layer, wherein the first interlayer bonding layer is in direct contact with the light blocking layer and the heat dissipation layer, and wherein one end of the heat dissipation layer protrudes further than one ends of the first cushion layer and the second cushion layer.

19. The display device of claim 18, further comprising:

a light blocking member disposed on the first surface of the display panel, wherein one ends of the light blocking layer and the heat dissipation layer overlap the light blocking member.

20. The display device of claim 18, wherein one end of the light blocking layer protrudes further than the one ends of the first cushion layer and the second cushion layer.

* * * * *